United States Patent
Iida

(10) Patent No.: US 8,031,809 B2
(45) Date of Patent: Oct. 4, 2011

(54) TEMPLATE PULSE GENERATING CIRCUIT, COMMUNICATION DEVICE, AND COMMUNICATION METHOD

(75) Inventor: Izumi Iida, Shiojiri (JP)

(73) Assignee: Seiko Epson Corporation (JP)

( * ) Notice: Subject to any disclaimer, the term of this patent is extended or adjusted under 35 U.S.C. 154(b) by 803 days.

(21) Appl. No.: 12/038,199

(22) Filed: Feb. 27, 2008

(65) Prior Publication Data

US 2008/0205559 A1 Aug. 28, 2008

(30) Foreign Application Priority Data

Feb. 28, 2007 (JP) ................................ 2007-049338
Feb. 12, 2008 (JP) ................................ 2008-030387

(51) Int. Cl.
*H03K 9/00* (2006.01)
(52) U.S. Cl. ........ 375/316; 375/219; 375/296; 375/238; 375/295; 375/259; 375/140; 375/141; 375/146; 375/130; 375/242; 332/106; 332/112; 455/91
(58) Field of Classification Search ............... 375/316, 375/219, 296, 238, 295, 259, 140, 141, 146, 375/130, 242; 332/106, 112; 455/91
See application file for complete search history.

(56) References Cited

U.S. PATENT DOCUMENTS

2004/0222865 A1* 11/2004 Romano et al. ............... 332/106

FOREIGN PATENT DOCUMENTS

| JP | 2004-241927 | 8/2004 |
|---|---|---|
| JP | 2004-528776 | 9/2004 |
| JP | 2005-517355 | 6/2005 |
| JP | 2005-217899 | 8/2005 |
| WO | WO 02/089345 | 11/2002 |

* cited by examiner

*Primary Examiner* — Dac Ha
*Assistant Examiner* — Zewdu Kassa
(74) *Attorney, Agent, or Firm* — Harness, Dickey & Pierce, P.L.C.

(57) ABSTRACT

A template pulse generating circuit that generates a template pulse used for detection of a received pulse in pulse communication includes an output mode switching circuit for switching an output mode in accordance with a supplied control signal between a continuous output mode that continuously outputs the template pulses and an intermittent output mode that intermittently outputs the template pulses so that the template pulse is generated in either one of the continuous output mode and the intermittent output mode.

15 Claims, 14 Drawing Sheets

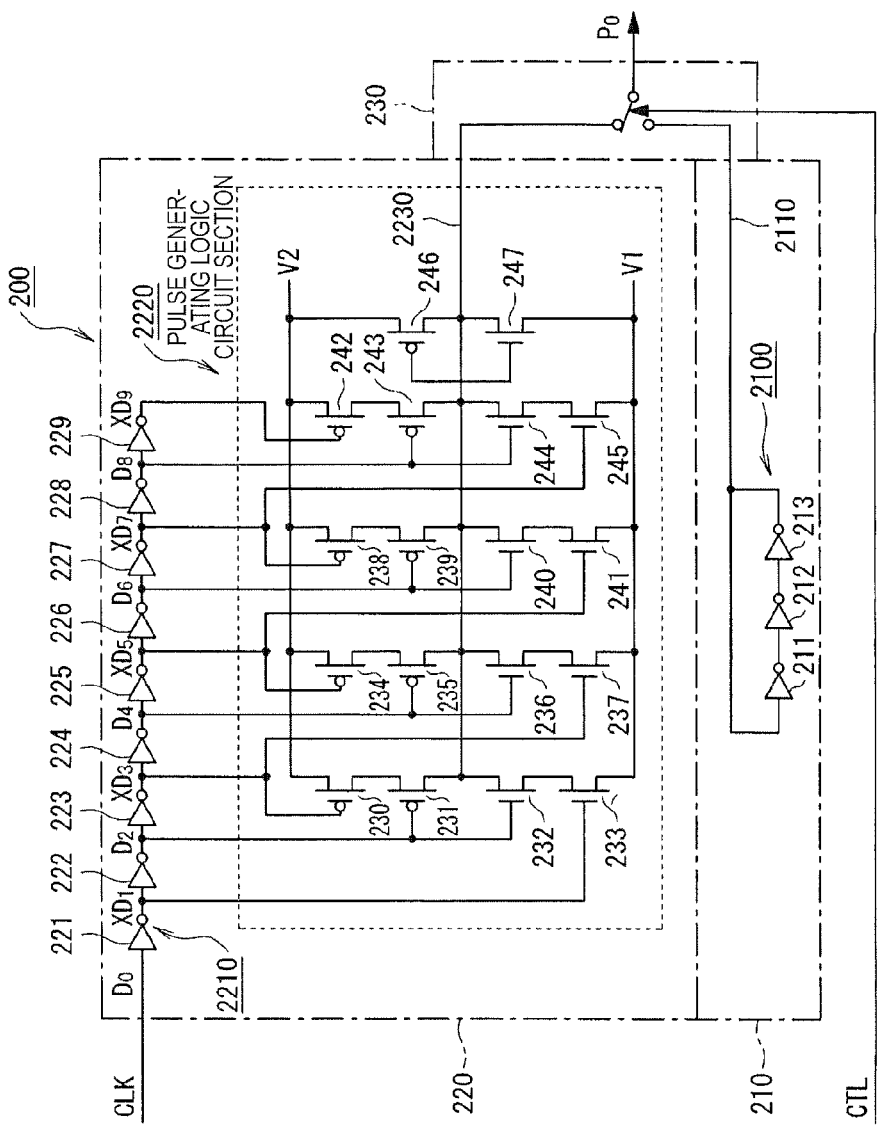
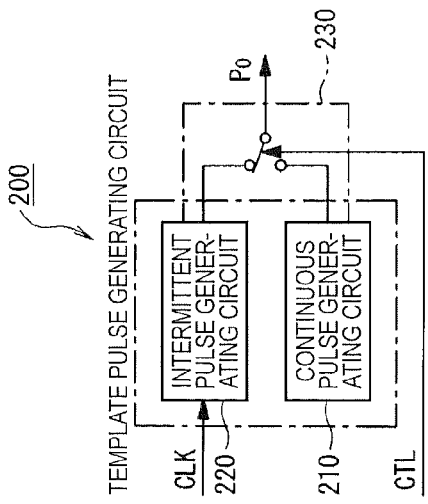
FIG. 2B
FIG. 2A

TEMPLATE PULSE GENERATING CIRCUIT, COMMUNICATION DEVICE, AND COMMUNICATION METHOD

BACKGROUND

1. Technical Field

The present invention relates to a template pulse generating circuit, a communication device, and a communication method well adapted to ultra wide band (UWB) communication, and in particular to a template pulse generating circuit, a communication device, and a communication method arranged to achieve low power consumption in a receiving system.

2. Related Art

In the UWB communication, very wide-band communication method using very short-period pulses is also called UWB impulse radio (UWB-IR) communication. In the UWB-IR method, modulation/demodulation can be performed only by a time base operation without using a past modulation method, and consequently, it is conceivable that simplification of the circuit and low power consumption can be expected (see e.g., JP-T-2004-528776 (paragraphs 0035-0040, FIG. 5) (hereinafter, Document 1), and JP-T-2005-517355 (paragraphs 0015-0020, FIG. 20) (hereinafter, Document 2)).

Further, it is proposed that in a receiving device for receiving a transmission signal composed of a pulse signal train, a template pulse with substantially the same generation interval as the transmission pulse is generated by a pulse generating section, the generation position of the template pulse is shifted in phase a predetermined distance by a phase shifting section, each of the template pulses thus shifted in phase and the received pulse are correlated with each other by a correlation section, and the synchronization capturing to the received signal is performed based on the correlation result (see JP-T-2004-241927 (paragraphs 0025-0028, FIG. 1) (hereinafter, Document 3)).

Further, there is presented a propose for achieving reduction of power consumption by controlling the generation position of the template pulse and stopping the receiving circuit in a period when no receiving pulse arrives (JP-A-2005-217899 (paragraphs 0023-0026, FIG. 1) (hereinafter, Document 4)).

As described above, although in the UWB communication, owing to the nature thereof, low power consumption communication can be realized, in the proposals described in the Documents 1 through 3 mentioned above, there is presented neither recognition of a technical problem of reducing the power consumption beyond the extent normally obtained by applying the present communication method, nor a particular proposal regarding a solution to such a technical problem, consequently.

Further, although the proposal for achieving reduction of the power consumption is disclosed in the Document 4, it seems impossible for the technology described in the document to achieve lower power consumption in a process for capturing synchronization by searching presence of the pulse itself from the condition in which timing of the arriving pulse is unknown.

In other words, also in the Document 4, there remains a technical problem that since in the process for capturing synchronization by searching presence of the pulse itself, the timing of the incoming pulse is searched while sequentially shifting the phase of the template pulse generated on the receiving side, the synchronization capturing takes time, and the power consumption is also increased correspondingly to the time.

SUMMARY

An advantage of some aspects of the invention is to provide a template pulse generating circuit, a communication device, and a communication method adapted to reduction of power consumption in pulse communication.

Examples of some aspects of the invention are listed below.

According to a first aspect of the invention, there is provided a template pulse generating circuit that generates a template pulse used for detection of a received pulse in pulse communication, including an output mode switching circuit that switches an output mode in accordance with a supplied control signal between a continuous output mode that continuously outputs the template pulses and an intermittent output mode that intermittently outputs the template pulses so that the template pulse is generated in either one of the continuous output mode and the intermittent output mode.

According to the template pulse generating circuit of the first aspect of the invention, since the output mode can be switched so that the template pulse is output in either a continuous output mode that continuously outputs the template pulse or an intermittent output mode that intermittently outputs the template pulse by the output mode switching circuit in response to receiving the control signal from, for example, the system controller provided to the communication device, the synchronization capturing is rapidly established using the continuous template pulses in a synchronization capturing mode at the beginning of the pulse communication, and thereafter the template pulses are intermittently output, thus significant reduction of the overall power consumption can be achieved.

According to a second aspect of the invention, in the template pulse generating circuit of the first aspect of the invention, there are further provided a continuous pulse generating circuit that continuously generates the template pulses, and an intermittent pulse generating circuit that intermittently generates the template pulses, and the output mode switching circuit switching the output mode by selecting an output of either one of the continuous pulse generating circuit and the intermittent pulse generating circuit.

According to the template pulse generating circuit of the second aspect of the invention, since the continuous pulse generating circuit that continuously outputs the template pulse and the intermittent pulse generating circuit that intermittently outputs the template pulse are particularly provided, and the outputs of these circuits are switched by the output mode switching circuit to output either one of the outputs in the template pulse generating circuit of the first aspect of the invention, the continuous output mode and the intermittent output mode of the template pulse can be switched by the output mode switching circuit with an extremely simple configuration.

According to a third aspect of the invention, in the template pulse generating circuit of the first aspect of the invention, there is further provided a variable mode pulse generating circuit for generating the template pulses continuously or intermittently in accordance with an oscillation mode switching signal supplied to a mode control signal input terminal, and the output mode switching circuit supplies the mode control signal input terminal of the variable mode pulse generating circuit with the oscillation mode switching signal.

According to the template pulse generating circuit of the third aspect of the invention, since the operation mode of the variable mode pulse generating circuit can particularly be switched by the oscillation mode switching signal from the output mode switching circuit in the template pulse generating circuit according to the first aspect of the invention, the output mode of the template pulse can be switched by the small circuit which is not provided with separate lines of circuits respectively for the continuous output mode and the intermittent output mode.

According to a fourth aspect of the invention, in the template pulse generating circuit of the third aspect of the invention, the variable mode pulse generating circuit is configured including a multi-stage inverter circuit section configured including a plurality of cascaded inverters, and a pulse generating logic circuit section including a plurality of switching elements controlled to be opened and closed by outputs of the inverters of the multi-stage inverter circuit section, and capable of generating the template pulse as an intermittent pulse signal with a higher frequency than the frequency of a clock pulse signal supplied to an input terminal of the first stage inverter of the inverters by connecting a predetermined output terminal to one of a positive side and a negative side of a power supply in accordance with opening and closing of the plurality of switching elements, wherein the multi-stage inverter circuit section is configured so that connection and disconnection of a feedback loop circuit can be switched in accordance with the oscillation mode switching signal supplied to the mode control signal input terminal, the feedback loop forming a ring oscillator circuit by forming a closed loop for feeding-back an output of a last stage inverter of a predetermined plurality of stages of inverters to an input terminal of a first stage inverter of the predetermined plurality of stages of inverters, and the pulse generating logic circuit section generates the template pulses one of continuously and intermittently in accordance with the switching of connection and disconnection of the feedback loop circuit.

According to the template pulse generating circuit of the fourth aspect of the invention, since the variable mode pulse generating circuit in the template pulse generating circuit according to the third aspect of the invention is particularly configured including a multi-stage inverter circuit section configured including a plurality of cascaded inverters, and a pulse generating logic circuit section including a plurality of switching elements controlled to be opened and closed by outputs of each of the stages of the inverters of the multi-stage inverter circuit section, and capable of generating the template pulse as an intermittent pulse signal with a higher frequency than the frequency of a clock pulse signal supplied to an input terminal of the first stage inverter of the respective stages of the inverters by connecting a predetermined output terminal to one of a positive side and a negative side of a power supply in accordance with opening and closing of the plurality of switching elements, and the template pulse with higher frequency than the clock pulse can be output from the pulse generating logic circuit section.

Further, the multi-stage inverter circuit section is configured so that connection and disconnection of a feedback loop circuit can be switched in accordance with the oscillation mode switching signal supplied to the mode control signal input terminal, the feedback loop forming a ring oscillator circuit by forming a closed loop for feeding-back an output of a last stage inverter of a predetermined plurality of stages of inverters to an input terminal of a first stage inverter of the predetermined plurality of stages of inverters, and the pulse generating logic circuit section generates the template pulse continuously or intermittently in accordance with the switching between connection and disconnection of the feedback loop circuit. Therefore, the template pulse with such a high frequency as described above can be output while selecting either the continuous mode or the intermittent mode by the small circuit.

Further, the difference in phase jitter and in frequency between the oscillation in the continuous output mode and the oscillation in the intermittent output mode caused by the variation in the characteristics of the circuit components of the inverters can be reduced.

According to a fifth aspect of the invention, in the template pulse generating circuit of the fourth aspect of the invention, the multi-stage inverter circuit section is formed of a plurality of cascaded differential inverter circuits.

According to the template pulse generating circuit of the fifth aspect of the invention, two lines of (differential) template pulses having reversed polarities from each other can simultaneously be obtained in either of the continuous output mode and the intermittent output mode described above in particular in the template pulse generating circuit of the fourth aspect of the invention.

According to a sixth aspect of the invention, in the template pulse generating circuit of either one of the fourth and the fifth aspects of the invention, there is further provided a counter for counting oscillation pulses by the ring oscillator circuit, and the output mode switching circuit is configured so as to determine the duration of the template pulses in the intermittent output mode in accordance with a count value of the counter.

According to the template pulse generating circuit of the sixth aspect of the invention, every duration of the intermittent pulses in the intermittent output mode can accurately be controlled by measuring the duration by the number of pulses by the counting operation of the counter for counting the oscillation pulses generated by the ring oscillator circuit in particular in the template pulse generating circuit according to either one of the fourth and fifth aspects of the invention.

Further, the difference in phase jitter and in frequency between the oscillation in the continuous output mode and the oscillation in the intermittent output mode caused by the variation in the characteristics of the circuit components of the inverters can be reduced.

According to a seventh aspect of the invention, in the template pulse generating circuit of the sixth aspect of the invention, the multi-stage inverter circuit section is configured so as to generate the template pulse of an I phase from an output terminal of a pulse generating logic circuit section of an I phase line by opening and closing the pertinent switching element of the corresponding pulse generating logic circuit section of the I phase line by an output of the even stage inverter, and to generate the template pulse of a Q phase from an output terminal of a pulse generating logic circuit section of a Q phase line by opening and closing the pertinent switching element of the corresponding pulse generating logic circuit section of the Q phase line by an output of the odd stage inverter.

According to the template pulse generating circuit of the seventh aspect of the invention, particularly in the template pulse generating circuit of the sixth aspect of the invention, the template pulses in the continuous output mode or the intermittent output mode can be obtained from the pulse generating logic circuit section of the I phase line driven by the output of each of the inverters in the even stages out of the inverters of the respective stages forming the multi-stage inverter circuit section, the template pulses of the I phase line can be used for detection of the received signal to the I phase line, at the same time, the template pulses in the continuous output mode or the intermittent output mode can be obtained from the pulse generating logic circuit section of the Q phase line driven by the output of each of the inverters in the odd stages out of the inverters of the respective stages forming the multi-stage inverter circuit section, and the template pulses of the Q phase line can be used for detection to the Q phase line.

According to an eighth aspect of the invention, in the template pulse generating circuit of the sixth aspect of the invention, the ring oscillator circuit is configured so as to have an oscillation frequency capable of being adjusted in accordance with a supplied frequency control signal.

According to the template pulse generating circuit of the eighth aspect of the invention, particularly in the template pulse generating circuit of the sixth aspect of the invention, since the ring oscillator circuit can be adjusted in the oscillation frequency in accordance with the frequency control signal supplied thereto, the template pulse generating circuit suitable for the synchronous detection method can be realized.

According to a ninth aspect of the invention, there is provided a communication device including the template pulse generating circuit according to either one of the first through the eighth aspects of the invention, a detection circuit that performs detection based on correlation between a received pulse and an output pulse of the template pulse generating circuit, and a system controller that supplies the template pulse generating circuit with a control signal that switches an operation mode so as to make the template pulse generating circuit operate in the continuous output mode in a synchronization capturing mode that performs synchronization capturing when detecting the received pulse, and to make the template pulse generating circuit operate in the intermittent output mode when the synchronization capturing is established.

According to the communication device of the ninth aspect of the invention, since the template pulse generating circuit operates in the continuous output mode in the synchronization capturing mode that performs the synchronization capturing when detecting the received pulse, and when the synchronization capturing is roughly established, the template pulse generating circuit operates in the intermittent output mode, the synchronization capturing can be established in a short period of time by continuously generating the template pulses at the beginning of the pulse communication, and thereafter the template pulse generating circuit is switched to the intermittent output mode, thus the power consumption can be reduced.

According to a tenth aspect of the invention, there is provided a communication device including the template pulse generating circuit according to either one of the seventh through the eighth aspects of the invention, an I phase pulse multiplier a template pulse of an I phase of the template pulse generating circuit by a received pulse, a Q phase pulse multiplier that multiplies a template pulse of a Q phase of the template pulse generating circuit by the received pulse, an I phase envelope detection processing circuit that executes an envelope detection process on an I phase multiplication output pulse as an output of the I phase pulse multiplier, a Q phase envelope detection processing circuit that executes the envelope detection process on a Q phase multiplication output pulse as an output of the Q phase pulse multiplier, an envelope signal adding circuit that adds to combine an I phase envelope signal as an output of the I phase envelope detection processing circuit and a Q phase envelope signal as an output of the Q phase envelope detection processing circuit with each other, a synchronization capturing processing section that performs the synchronization capturing based on a combined envelope signal as an output of the envelope signal adding circuit, a pulse position following-up processing section that performs a pulse position following-up process based on the combined envelope signal, and a system controller that supplies the template pulse generating circuit with a control signal that switches an operation mode so as to make the template pulse generating circuit operate in the continuous output mode in a synchronization capturing mode in which the synchronization capturing processing section performs the synchronization capturing, and to make the template pulse generating circuit operate in the intermittent output mode when the synchronization capturing is established.

According to the communication device of the tenth aspect of the invention, the I phase envelope signal and the Q phase envelope signal are obtained by executing the envelope detection process separately by the I phase envelope detection processing circuit and the Q phase envelope detection processing circuit on the I phase multiplication output pulse and the Q phase multiplication output pulse obtained by multiplying the I phase template pulse and the Q phase template pulse of the template pulse generating circuit by the received pulse respectively by the I phase pulse multiplier and the Q phase pulse multiplier, and the I phase envelope signal and the Q phase envelope signal are added to be combined by the envelope signal adding circuit to obtain the combined envelope signal.

A synchronization capturing processing section performs the synchronization capturing based on the combined envelope signal, and subsequently, a pulse position following-up processing section performs the pulse position following-up process to obtain the baseband signal (data) as a detection output regarding the received pulse signal.

In this case, under control of the system controller, the operation mode is switched so as to make the template pulse generating circuit operate in the continuous output mode in the synchronization capturing mode in which the synchronization capturing processing section performs the synchronization capturing, and to make the template pulse generating circuit operate in the intermittent output mode when the synchronization capturing is roughly established.

Therefore, it becomes possible to establish the synchronization capturing in a short period of time by continuously generating the template pulses at the beginning of the pulse communication, and thereafter, the template pulse generating circuit is switched to the intermittent output mode, thus the power consumption is reduced.

According to an eleventh aspect of the invention, in the communication device of the tenth aspect of the invention, the I phase envelope detection processing circuit is configured including an I phase pulse square circuit that squares the I phase multiplication output pulse, and the Q phase envelope detection processing circuit is configured including a Q phase pulse square circuit that squares the Q phase multiplication output pulse.

According to the communication device of the eleventh aspect of the invention, particularly in the communication device of the tenth aspect of the invention, the synchronization capturing and the pulse position following-up process is performed based on the combination value of the square values of the I phase multiplication output pulse and the Q phase multiplication output pulse obtained by the I phase pulse square circuit and Q phase pulse square circuit, in other words, the values corresponding to the envelope detection of pulses of the I phase and the Q phase.

According to a twelfth aspect of the invention, in the communication device of the tenth aspect of the invention, the I phase envelope detection processing circuit is configured including an I phase pulse rectifying circuit that rectifies the I phase multiplication output pulse, and the Q phase envelope detection processing circuit is configured including a Q phase pulse rectifying circuit that rectifies the Q phase multiplication output pulse.

According to the communication device of the twelfth aspect of the invention, particularly in the communication device of the tenth aspect of the invention, the synchronization capturing and the pulse position following-up process is performed based on the combination value of the rectified values of the I phase multiplication output pulse and the Q phase multiplication output pulse obtained by the I phase pulse rectifying circuit and Q phase pulse rectifying circuit, in other words, the values corresponding to the envelope detection of pulses of the I phase and the Q phase.

According to a thirteenth aspect of the invention, in the communication device of either one of the tenth through twelfth aspects of the invention, the pulse position following-up processing section is configured so as to performing the pulse position following-up process based on comparison between an integration value of a phase advance DLL circuit that performs a phase advance process for advancing a phase and an integration value of a phase delay DLL circuit that performs a phase delay process for delaying a phase, and to obtain a demodulated output based on an output of a same phase DLL circuit that performs a phase keeping process for keeping a phase.

According to the communication device of the thirteenth aspect of the invention, particularly in the communication device of either one of the tenth through twelfth aspects of the invention, the pulse position following-up process is performed based on the comparison between the integration values of the respective outputs of the phase advance DLL circuit and the phase delay DLL circuit, and the demodulated output can be obtained based on the output of the same phase DLL circuit out of the phase advance DLL circuit, the same phase DLL circuit, and the phase delay DLL circuit of the pulse position following-up processing section.

According to a fourteenth aspect of the invention, in the communication device of either one of the tenth through thirteenth aspects of the invention, the synchronization capturing processing section is configured including a synchronous detection functional section that performs a frequency adjusting process that matches the frequencies of the template pulse and the received pulse in addition to performing a phase synchronization process between the template pulse and the received pulse.

According to the communication device of the fourteenth aspect of the invention, particularly in the communication device of either one of the tenth through thirteenth aspects of the invention, a frequency adjusting process for matching the frequencies of the template pulse and the received pulse is performed in the synchronous detection functional section of the synchronization capturing processing section in addition to a phase synchronization process between the template pulse and the received pulse, thus the detection processing result with high accuracy can be obtained.

According to a fifteenth aspect of the invention, in the communication device of either one of the ninth through fourteenth aspects of the invention, there is further provided a storage functional section that stores pulse positional information obtained when the synchronization capturing is established.

According to the communication device of the fifteenth aspect of the invention, particularly in the communication device of either one of the ninth through fourteenth aspects of the invention, since the pulse positional information obtained when the synchronization capturing is established is stored into the storage functional section, the clock pulse is supplied to the template pulse generating circuit so as to be synchronized with the timing corresponding to the pulse positional information stored in the storage functional section, thus the detection process to the received pulse can be executed using the template pulse with an appropriately adjusted phase.

According to a sixteenth aspect of the invention, in the communication device of the fifteenth aspect of the invention, the system controller is configured so as to supply the template pulse generating circuit with a clock pulse used for operating the template pulse generating circuit in the intermittent output mode in accordance with the pulse position information stored in the storage functional section.

According to the communication device of the sixteenth aspect of the invention, particularly in the communication device of the fifteenth aspect of the invention, the system controller supplies the template pulse generating circuit with the clock pulses so as to be synchronized with the timing corresponding to the pulse positional information stored in the storage functional section. Therefore, the detection process to the received pulse can be executed using the template pulses with properly adjusted phases.

According to a seventeenth aspect of the invention, in the communication device of either one of the ninth through sixteenth aspect of the invention, there is further provided a power supply control section that controls supply of an operation power, and the system controller controls the power supply control section to partially stop supplying the power in a period when no received pulse arrives.

According to the communication device of the seventeenth aspect of the invention, particularly in either one of the ninth through sixteenth aspects of the invention, by partially stopping supplying the operation power of the communication device in the period when no received pulse arrives, unnecessary standby power consumption can be minimized.

According to a eighteenth aspect of the invention, there is provided a communication method including the step of selecting a continuous output mode that continuously generates template pulses used for detection of a received pulse in a period for performing synchronization capturing in pulse communication, and the step of switching an output mode to an intermittent output mode that intermittently generates the template pulses in a period after the synchronization capturing is established.

According to the communication method of the eighteenth aspect of the invention, it is arranged that the synchronization capturing is rapidly established using the continuous template pulses in the synchronization capturing mode at the beginning of the pulse communication, and thereafter the template pulses are output intermittently, thus it becomes possible to achieve significant reduction of the overall power consumption.

BRIEF DESCRIPTION OF THE DRAWINGS

The invention will be described with reference to the accompanying drawings, wherein like numbers refer to like elements.

FIGS. 2A and 2B are diagrams showing a pulse generating circuit as an embodiment of the invention.

DESCRIPTION OF EXEMPLARY EMBODIMENTS

Figure 1:
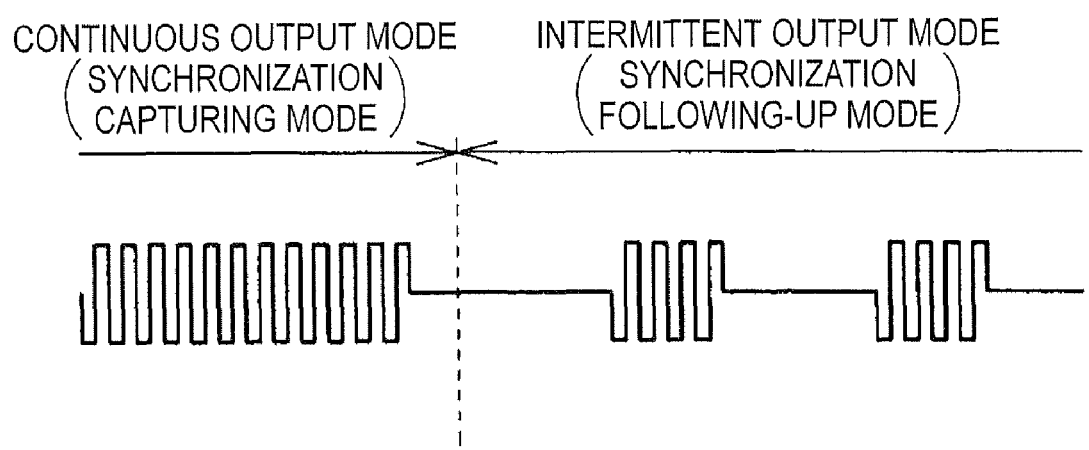
FIG. 1 is a waveform chart of an output signal of a pulse generating circuit as an example of the invention applied to a communication method of an embodiment of the invention.

Embodiments of the invention will hereinafter be explained with reference to the accompanying drawings. It should be noted that in the drawings the descriptions refers to below, substantial parts to be focused on in the explanations are arbitrarily exaggerated and other parts than the substantial parts are arbitrarily simplified of omitted for the sake of convenience.

FIG. 1 is a waveform chart of an output signal (template pulse) representing a distinguishing operation of a pulse generating circuit as an example of the invention applied to a communication method of an embodiment of the invention. In the embodiment of the invention, as shown in the drawing, in a synchronization capturing mode for performing a pulse position searching operation at the beginning of pulse communication, the synchronization capturing is rapidly established using continuous template pulses in a continuous output mode of the pulse generating circuit.

After the synchronization capturing is substantially established, the mode is shifted to a synchronization following-up mode for performing pulse position following-up operation (accurate pulse position adjustment) to intermittently output the template pulses in an intermittent output mode of the pulse generating circuit, thus drastic reduction of overall power consumption can be achieved.

FIGS. 2A and 2B are diagrams showing a pulse generating circuit as an embodiment of the invention for generating the template pulses shown in FIG. 1.

FIG. 2A is a block diagram showing a rough outline of the pulse generating circuit as an embodiment of the invention, and FIG. 2B is a circuit diagram showing a more detailed configuration example of the block diagram shown in FIG. 2A.

As shown in FIG. 2A, the pulse generating circuit as an embodiment of the invention is provided with a continuous pulse generating circuit 210 for continuously outputting the pulses and an intermittent pulse generating circuit 220 for intermittently outputting the pulses, and an output mode switching circuit 230 for performing a switching operation in accordance with a control signal CTL supplied thereto switches these outputs to output either one of the outputs as a template pulse $P_0$.

Therefore, the continuous output mode and the intermittent output mode of the template pulse are switched from each other by the output mode switching circuit 230 with an extremely simple configuration.

It should be noted that the continuous pulse generating circuit 210 is, for example, a free running circuit formed of a ring oscillator circuit, and the intermittent pulse generating circuit 220 is a circuit operating with a clock pulse CTL supplied externally, which will be explained in detail below with reference to FIG. 2B.

In FIG. 2B, the continuous pulse generating circuit 210 has inverters 211, 212, and 213 cascaded to be a three-stage inverter, and is arranged to supply the input of the first stage inverter 211 with the output of the last stage inverter 213, thereby forming the ring oscillator.

On a pulse output terminal 2110 of the continuous pulse generating circuit 210, there are generated continuous template pulses $P_0$ shown in FIG. 1 as the continuous output mode (the synchronization capturing mode in the operation of a communication device applying the present circuit).

Further, the intermittent pulse generating circuit 220 is composed including a multi-stage inverter circuit section 2210 composed of nine stages of cascaded inverters 221 through 229, and a pulse generating logic circuit section 2220 including a plurality of switching elements the switching operations of which are controlled by the outputs of the inverters in the respective stages of the multi-stage inverter circuit section 2210, and for obtaining the template pulse $P_0$, which is a pulse signal having a higher frequency than that of the clock pulse CLK supplied to the input of the first stage inverter out of the inverters in the respective stages, by sequentially and selectively connecting the predetermined output terminal to a positive side V1 or a negative side V2 of a power supply in accordance with open/close operation of the plurality of switching elements.

The pulse generating logic circuit 2220 has P-channel MOS transistors 230, 231, 234, 235, 238, 239, 242, 243, and 246, and N-channel MOS transistors 232, 233, 236, 237, 240, 241, 244, and 245 as the switching elements connected as shown in the drawing, and further, the positive poser supply V1 and the negative power supply V2 are connected as shown in the drawing.

A pulse D0 supplied to the input terminal of the first stage inverter 221 of the multi-stage inverter circuit section 2210 is propagated sequentially through the inverters while being delayed td every stage of the inverters and inverted in logic, thus delayed signals are output from the respective stages.

In other words, assuming that the signal CLK (the clock pulse D0) applied to the input terminal of the first stage inverter 221 is positive logic, k is an integer, and X is added as the header of the signal name for expressing negative logic of the signal, the following signals are output from ith stage of the multi-stage inverter circuit section 2210: $XD_{2k-1}$ when i=2k−1; or $D_{2k}$ when i=2k.

The N-channel MOS transistors 233 and 232 become a conducting state to connect a pulse output terminal 2230 to the voltage level V1 of the positive side power supply when the output XD1 of the first stage inverter 221 and the output D2 of the second stage inverter are high, respectively.

Then, the P-channel MOS transistors 230 and 231 become a conducting state to connect the pulse output terminal 2230 to the voltage level V2 of the negative side power supply when the output D2 of the second stage inverter and the output XD3 of the third stage inverter are low (i.e., the negative logic of D2 and D3 are both high), respectively.

Similarly, the N-channel MOS transistors 236, 237, 240, 241, 244, and 245 become conducting state to connect the pulse output terminal 2230 to the voltage level V1 of the positive side power supply when the output $XD_{2k-1}$ of the 2k–1th stage inverter and the output $D_{2k}$ of the 2kth stage inverter are high, respectively, namely a logical product of the $XD_{2k-1}$ and the $D_{2k}$ is true.

Then, the P-channel MOS transistors 234, 235, 248, 249, 242, and 243 become conducting state to connect the pulse output terminal 2230 to the voltage level V2 of the positive side power supply when the output $D_{2k}$ of the 2kth stage inverter and the output $XD_{2k+1}$ of the 2k+1th stage inverter are low, respectively, namely a logical product of the $XD_{2k}$, which is the negative logic of the $D_{2k}$, and the $D_{2k+1}$, which is the negative logic of the $XD_{2k+1}$, is true.

According to the operation described above, the intermittent template pulses $P_O$ shown in FIG. 1 as the intermittent output mode (the synchronization following-up mode in the operation of the communication device applying the present circuit) can be formed on the pulse output terminal 2230 of the pulse generating logic circuit section 2220.

The continuous template pulses appear on the pulse output terminal 2110 of the continuous pulse generating circuit 210 described above and the intermittent template pulses appear on the pulse output terminal 2230 of the pulse generating logic circuit section 2220 are switched by the output mode switching circuit 230 responsive to the control signal CTL, and output as the template pulses $P_O$ in the continuous output mode and the intermittent output mode, respectively.

Figure 3A:
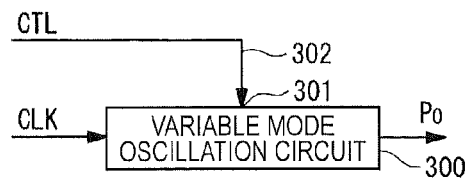
FIGS. 3A through 3C are diagrams showing a pulse generating circuit as another embodiment of the invention.
Figure 3B:
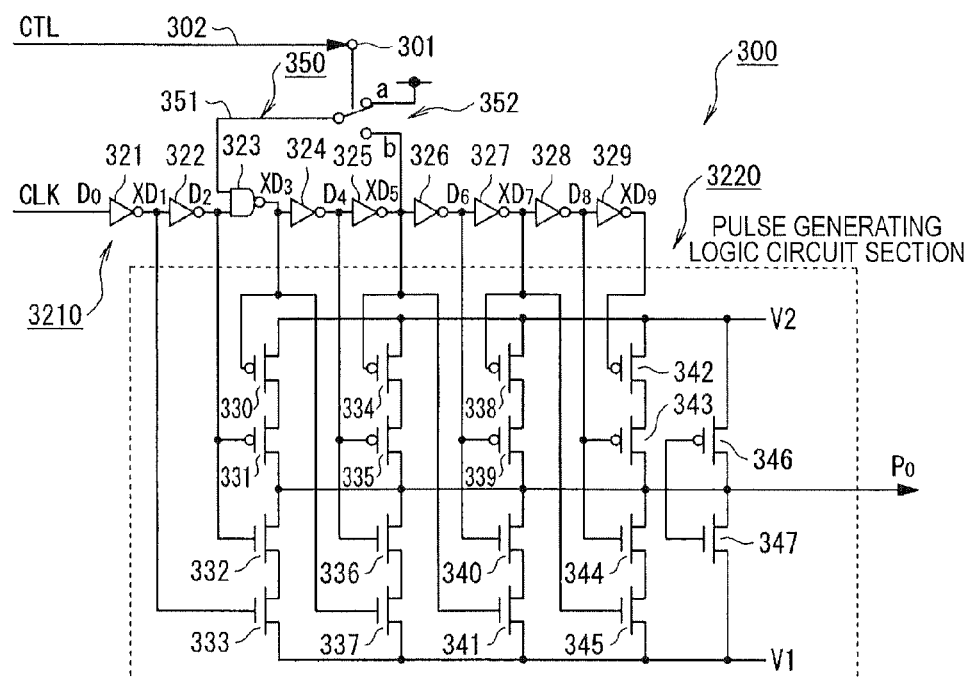
Figure 3C:
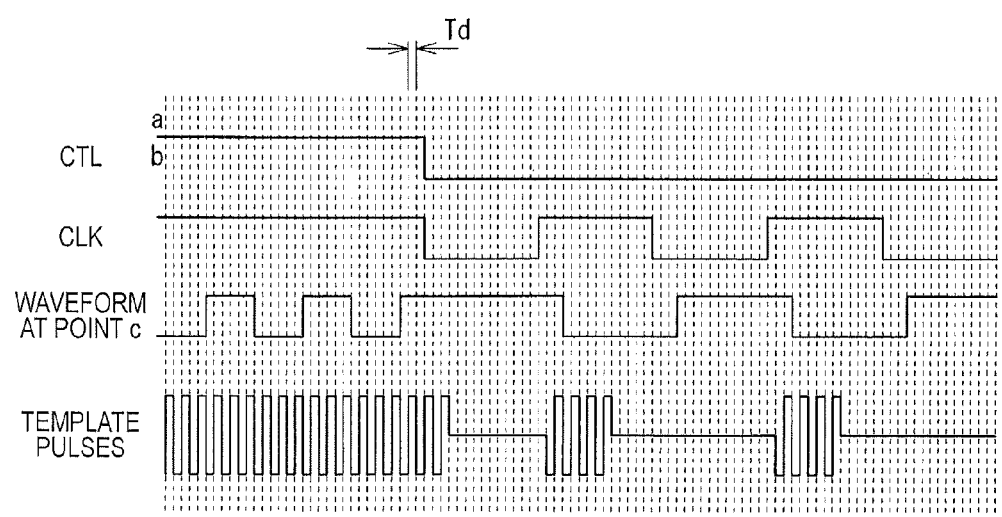

FIGS. 3A through 3C are diagrams showing a pulse generating circuit as another embodiment of the invention for generating the template pulses shown in FIG. 1.

FIG. 3A is a block diagram showing a rough outline of the pulse generating circuit as an embodiment of the invention, FIG. 3B is a circuit diagram showing a more detailed configuration example of the block diagram shown in FIG. 3A, and FIG. 3C is a timing chart of signals at some sections of the circuit shown in FIG. 3B.

The template pulse generating circuit of FIG. 3A is provided with a variable mode oscillator circuit 300 for generating the template pulses $P_O$ continuously or intermittently in accordance with the control signal CTL as a oscillation mode switching signal supplied to a mode control signal input terminal 301 thereof, and is arranged so that a output mode switching circuit 302 supplies the mode control signal input terminal 301 of the variable mode oscillating circuit 300 with the oscillation mode switching signal CTL.

As shown in detail in FIG. 3B, the variable mode oscillator circuit 300 is formed including a multi-stage inverter circuit section 3210 composed of nine stages of cascaded inverters (or a functional section as an inverter) including inverters 321, 322, a NAND circuit 323, which functions as an inverter when a positive voltage is applied to one input terminal thereof, and inverters 324 through 329, and a pulse generating logic circuit section 3220 including a plurality of switching elements the switching operations of which are controlled by the outputs of the inverters in the respective stages of the multi-stage inverter circuit section 3210, and for obtaining the template pulse $P_O$, which is a pulse signal having a higher frequency than that of the clock pulse CLK supplied to the input of the first stage inverter out of the inverters in the respective stages, by sequentially and selectively connecting the predetermined output terminal to a positive side V2 or a negative side V1 of a power supply in accordance with open/close operation of the plurality of switching elements.

The pulse generating logic circuit 3220 has P-channel MOS transistors 330, 331, 334, 335, 338, 339, 342, 343, and 346, and N-channel MOS transistors 332, 333, 336, 337, 340, 341, 344, and 345 as the switching elements connected as shown in the drawing, and further, the positive power supply V2 and the negative power supply V1 are connected as shown in the drawing.

The pulse generating logic circuit section 3220 itself has completely the same configuration as that of the pulse generating logic circuit section 2220 described with reference to FIG. 2B, and generates the intermittent template pulses $P_O$ in a similar manner to what is shown in FIG. 2B in accordance with the outputs from the respective stages of the multi-stage inverter circuit section 3210 supplied thereto.

On the other hand, in the multi-stage inverter circuit 3210, there is formed a ring oscillator circuit 350 substantially with three stages of inverters composed of the NAND circuit 323, which functions as the inverter when a positive voltage is applied to one input terminal thereof, the inverters 324, 325 disposed subsequently to the NAND circuit 323, and a feedback loop circuit 351 disposed so as to form a closed loop to feedback the output of the inverter 325 to the other input terminal of the NAND circuit 323.

In the feedback loop circuit 351, there is inserted a switching circuit 352 for switching connection/disconnection of the feedback loop circuit 351 in accordance with the control signal CTL as the oscillation mode switching signal.

The operation of the template pulse generating circuit shown in FIG. 3B will hereinafter be explained referring, according to needs, to FIG. 3C showing the timing chart of signals at some sections of the circuit shown in FIG. 3B.

When the switching circuit 352 is connected to the contact b side in accordance with the oscillation mode switching signal CTL to close the feedback loop circuit 351, since the ring oscillator circuit 350 substantially composed of the three stages of inverters as described above holds clock pulse CLK in the high level, the input terminal of the NAND circuit 323 at the point $D_2$ is held in high level, thus the NAND circuit 323 functions as the inverter, and the ring oscillator circuit 350 performs an oscillation operation.

The period of the output waveform of the ring oscillator circuit 350 is obtained as 6×Td assuming that the delay of each stage of the inverters is Td. The ring oscillator circuit 350 is formed including the NAND circuit 323, the inverters 324, 325 disposed subsequently to the NAND circuit 323, and the feedback loop circuit 351 in the middle of the multi-stage inverter circuit section 3210 composed substantially of nine stages of cascaded inverters described above, and functions as the ring oscillator circuit when the feedback loop circuit 351 is closed.

Therefore, the ring oscillator circuit 350 outputs three cycles of pulse waveforms and then stops. However, since the next output of the inverter is fed-back through the feedback loop circuit 351 in response to just the third pulse, the next pulse is output without interruption in the pulse waveform, and this operation is repeated.

In other words, when the switching circuit 352 is connected to the contact b side to close the feedback loop circuit 351, and the clock pulse CLK is held to the high level, the variable mode oscillator circuit 300 operates in the continuous output mode.

On the other hand, when the switching circuit 352 is connected to the contact a side in response to the oscillation mode switching signal CTL, the one input terminal of the NAND circuit 323 is held in the high level, and the NAND circuit 323 functions as the inverter also in this case. Thus, the pulse is output with the timing of the rising edge of the clock pulse CLK.

Since the template pulse generating circuit shown in FIG. 3B the same inverters are used in both the continuous oscillation and the intermittent pulse oscillation, there can be obtained an advantage that differences in phase jitter and frequency between the oscillation in the continuous output mode and the oscillation in the intermittent output mode caused by a variation in the characteristics of the circuit components of each of the inverters can be reduced in comparison with the circuit shown in FIG. 3A.

Figure 4:
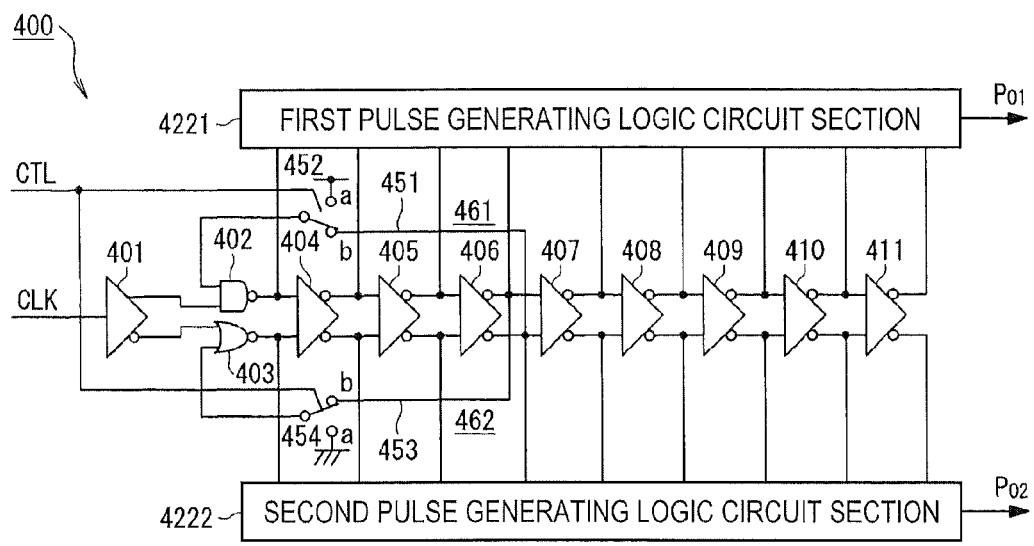
FIG. 4 is a diagram showing a pulse generating circuit as still another embodiment of the invention.

FIG. 4 is a diagram showing a pulse generating circuit as still another embodiment of the invention for generating the template pulses shown in FIG. 1.

The point in which the pulse generating circuit 400 is different from the circuit described above is that the pulse generating circuit 400 is arranged so that the template pulses are each output as a pair of differential outputs having phases inverted from each other.

In other words, a differential signal forming circuit 401 is provided as a first stage circuit for receiving the clock pulses CLK, one input terminal of a NAND circuit 402 is connected to a noninverting output terminal of the differential signal forming circuit 401, and one input terminal of a NOR circuit 403 is connected to an inverting output terminal, on the other hand. Both of the NAND circuit 402 and the NOR circuit 403 each function as an inverter when the clock pulse CLK is held in the high level similarly to the embodiment described above.

On the output side of the NAND circuit 402 and the NOR circuit 403, there is disposed a differential inverter 404 receiving the outputs of the NAND circuit 402 and the NOR circuit 403 in upper and lower (in the drawing) inputs thereof, on the output side of the differential inverter 405, a differential inverter 405 receiving a pair of output of the differential inverter 404 in the inputs thereof is cascaded, and thereafter, differential inverters 406, 407, 408, 409, 410, and 411 are similarly cascaded in this order.

A closed loop is formed so that the lower (in the drawing) output of the differential inverter 406 in these cascaded differential inverters is fed-back to the other input terminal of the NAND circuit 402 via the feedback loop 451, thereby forming a ring oscillator circuit 461 composed of the NAND circuit 402, the differential inverters 404, 405, and 406 cascaded each other. In the feedback loop 451, there is inserted a switching circuit 452 for switching between connection and disconnection of the feedback loop 451.

Further, a closed loop is formed so that the upper (in the drawing) output of the differential inverter 406 is fed-back to the other input of the NOR circuit 403 via a feedback loop 453, thereby forming a ring oscillator circuit 462 composed of the NOR circuit 403, the differential inverters 404, 405, and 406 cascaded each other. In the feedback loop 452, there is inserted a switching circuit 454 for switching between connection and disconnection of the feedback loop 452.

The output of the inverter of each of the stages of cascaded differential inverters including the NAND circuit 402 and the NOR circuit 403 functioning as the first stage differential inverter is supplied to both a first pulse generating logic circuit section 4221 for obtaining the template pulses $P_{O1}$ from one line of the differential output pulses by driving the corresponding switching element by that output and a second pulse generating logic circuit section 4222 for obtaining the template pulses $P_{O2}$ from the other line of the differential output pulses, and the first pulse generating logic circuit section 4221 and the second pulse generating logic circuit section 4222 each function in a substantially similar manner to what is explained with reference to FIGS. 3A through 3C.

In other words, in the continuous output mode in which the template pulses are continuously output, by setting the two switching circuits 452 and 453 to the b side and holding the CLK in the high level, the NAND circuit 402 and the NOR circuit 403 each function as an inverter, thus the ring oscillator with a waveform frequency of 8×Td can be formed.

Since the four cycles of modulated waveform are output from each of the first pulse generating logic circuit section 4221 and the second pulse generating logic circuit section 4222, as a result, generation of the template pulses $P_{O1}$ and $P_{O2}$ in the continuous mode without interruption is continued.

On the other hand, when the two switching circuit 452 and 453 are connected to the a side, the template pulses $P_{O1}$ and $P_{O2}$ in the intermittent output mode are output from the first pulse generating circuit section 4221 and the second pulse generating circuit section 4222, respectively, with the timing of the rising edges of the clock pulses CLK.

Figure 5:
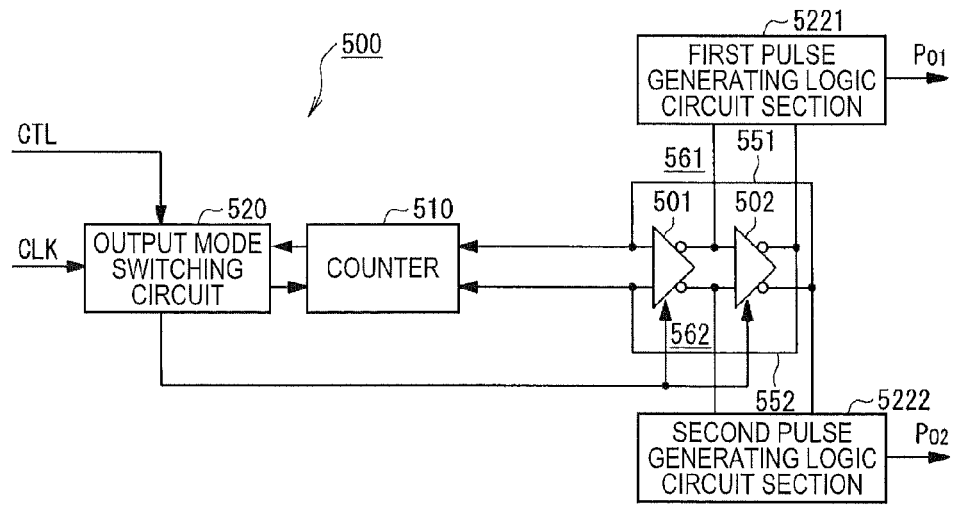
FIG. 5 is a diagram showing a pulse generating circuit as still another embodiment of the invention.

FIG. 5 is a diagram showing a pulse generating circuit 500 as still another embodiment of the invention. Ring oscillator circuits 561, 562 are respectively composed of cascaded differential inverters 501, 502, a feedback loop 551 for feeding-back a lower (in the drawing) output of the latter stage differential inverter 502 to an upper (in the drawing) input of the former stage differential inverter 501, and a feedback loop 552 for feeding-back an upper (in the drawing) output of the latter stage differential inverter 502 to a lower (in the drawing) input of the former stage differential inverter 501.

There are provided a first and second pulse generating logic circuit sections 5221, 5222 including a plurality of switching elements controlled to be opened or closed by the respective output of the differential inverters 501, 502, and obtaining the template pulses on the output terminals thereof by sequentially and selectively connecting the predetermined output terminal to the positive side or the negative side of the power supply in accordance with the opening and closing of the plurality of switching elements.

It is configured that each of the outputs of the ring oscillator circuits 561, 562 is supplied to a counter 510 to be counted, and the oscillation operations of the ring oscillator circuits 561, 562 and the counting operation of the counter 510 are controlled by an output mode switching circuit 520 for performing the output mode switching operation corresponding to the supplying condition of the clock pulse CLK and the count of the counter 510 in response to the control signal CTL.

Specifically, when the continuous output mode is set by the control signal CTL, the output mode switching circuit 520 makes the ring oscillator circuits 561, 562 continuously perform the oscillation operations independently of the counting condition of the counter 510. In response to the continuous oscillation operation, the template pulses $P_{O1}$ and $P_{O2}$ in the continuous output mode can be obtained from the first and the second pulse generating logic circuit sections 5221, 5222.

When the intermittent output mode is set by the control signal CTL, the counter 510 is kept in a reset condition, and the ring oscillator circuits 561, 562 are also stopped until the rising edge of the clock pulse CLK is input.

When the rising edge of the clock pulse CLK is input, the reset condition of the counter 510 is released, and at the same time, the ring oscillator circuits 561, 562 are made operate.

When counting a predetermined number of the output pulses of the ring oscillator circuits 561, 562, the counter 510 notifies the output mode switching circuit 520 of the result, and the output mode switching circuit 520 thus notified stops the ring oscillator circuits 561, 562, and resets the counter 510.

By repeating the counting of the output pulses of the ring oscillator circuits 561, 562 by the counter 510 and the resetting of the counter 510, the template pulses $P_{O1}$ and $P_{O2}$ in the intermittent output mode can be obtained from the first and the second pulse generating logic circuit sections 5221, 5222.

In this case, since every duration of the intermittent pulses in the intermittent output mode is measured with the number of pulses obtained by the measuring operation by the counter 510, the every duration and the phases of the template pulses can be controlled with high accuracy.

Further, the difference in phase jitter and in frequency between the oscillation in the continuous output mode and the oscillation in the intermittent output mode caused by the variation in the characteristics of the circuit components of the differential inverters 501, 502 can be reduced.

It should be noted that although in the present embodiment the differential pulses are generated using the differential inverters, a single-ended configuration can also be adopted.

Figure 6:
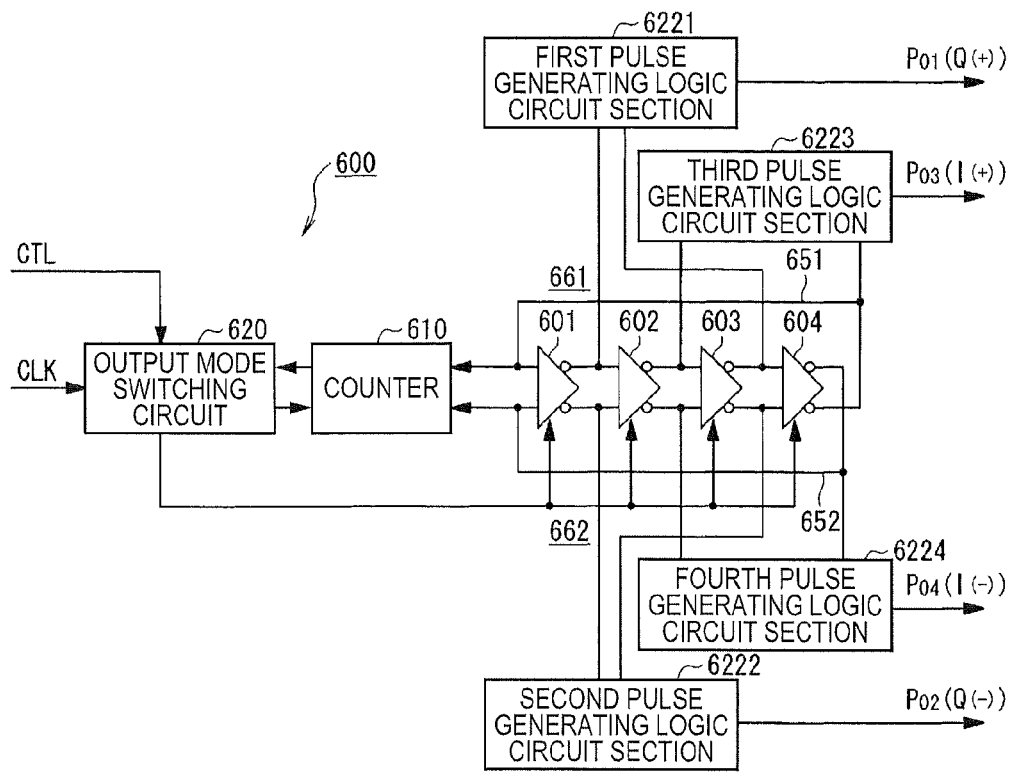
FIG. 6 is a diagram showing a pulse generating circuit as still another embodiment of the invention.

FIG. 6 is a diagram showing a pulse generating circuit as still another embodiment of the invention. The point in which the template pulse generating circuit 600 is different from the template pulse generating circuit 500 described above with reference to the FIG. 5 is that the circuit shown in FIG. 6 is configured so that the template pulses of I phase line and the template pulses of Q phase line can simultaneously be obtained while the circuit shown in FIG. 5 has a configuration of obtaining the template pulse as a pair of differential outputs.

There are provided a first pulse generating logic circuit section 6221 including a plurality of switching elements controlled to be opened or closed by the output pulses of the upper (in the drawing) output terminals of the respective odd stage (the first stage and the third stage) differential inverters 601, 603 out of the cascaded differential inverters 601 through 604, and for obtaining positive side (+) template pulses $P_{O1}$ of the Q phase on the output terminal by sequentially and selectively connecting a predetermined output terminal to the positive side or the negative side of the power supply in accordance with opening and closing of the plurality of switching elements, and a second pulse generating logic circuit section 6222 for obtaining negative side (−) template pulses $P_{O2}$ of the Q phase on the output terminal similarly driven to be switched by the output pulse on the lower (in the drawing) output terminals of the differential inverters 601, 603 described above.

Further, there are provided a third pulse generating logic circuit section 6223 including a plurality of switching elements controlled to be opened or closed by the output pulses of the upper (in the drawing) output terminals of the respective even stage (the second stage and the fourth stage) differential inverters 602, 604 out of the cascaded differential inverters 601 through 604, and for obtaining positive side (+) template pulses $P_{O3}$ of the I phase on the output terminal by sequentially and selectively connecting a predetermined output terminal to the positive side or the negative side of the power supply in accordance with opening and closing of the plurality of switching elements, and a fourth pulse generating logic circuit section 6224 for obtaining negative side (−) template pulses $P_{O4}$ of the I phase on the output terminal similarly driven to be switched by the output pulse on the lower (in the drawing) output terminals of the differential inverters 602, 604 described above.

It is configured that each of the outputs of the ring oscillator circuits 661, 662 is supplied to a counter 610 to be counted, and the oscillation operations of the ring oscillator circuits 661, 662 and the counting operation of the counter 610 are controlled by an output mode switching circuit 620 for performing the output mode switching operation corresponding to the supplying condition of the clock pulse CLK and the count of the counter 610 in response to the control signal CTL.

Specifically, when the continuous output mode is set by the control signal CTL, the output mode switching circuit 620 makes the ring oscillator circuits 661, 662 continuously perform the oscillation operations independently of the counting condition of the counter 610.

In response to the continuous oscillation operation of the ring oscillator circuit, the template pulses $P_{O1}$ and $P_{O2}$ as the differential pulse output of the Q phase described above in the continuous output mode are obtained from the first and the second pulse generating logic circuit sections 6221 and 6222, and at the same time, the template pulses $P_{O3}$ and $P_{O4}$ as the differential pulse output of the I phase described above in the continuous output mode are obtained from the third and the fourth pulse generating logic circuit sections 6223 and 6224.

When the intermittent output mode is set by the control signal CTL, the counter 610 is kept in a reset condition, and the ring oscillator circuits 661, 662 are also stopped until the rising edge of the clock pulse CLK is input.

When the rising edge of the clock pulse CLK is input, the reset condition of the counter 610 is released, and at the same time, the ring oscillator circuits 661, 662 are made operate.

When counting a predetermined number of the output pulses of the ring oscillator circuits 661, 662, the counter 610 notifies the output mode switching circuit 620 of the result, and the output mode switching circuit 620 thus notified stops the ring oscillator circuits 661, 662, and resets the counter 610.

By repeating the counting of the output pulses of the ring oscillator circuits 661, 662 by the counter 610 as described above and the resetting of the counter 610, the template pulses $P_{O1}$ and $P_{O2}$ as the differential pulse output of the Q phase described above in the intermittent output mode are obtained from the first and the second pulse generating logic circuit sections 6221 and 6222, and at the same time, the template pulses $P_{O3}$ and $P_{O4}$ as the differential pulse output of the I phase described above in the intermittent output mode are obtained from the third and the fourth pulse generating logic circuit sections 6223 and 6224.

In this case, since every duration of the intermittent pulses in the intermittent output mode is measured with the number of pulses obtained by the measuring operation by the counter 610, every duration and the phases of the template pulses can be controlled with high accuracy.

Further, the difference in phase jitter and in frequency between the oscillation in the continuous output mode and the oscillation in the intermittent output mode caused by the variation in the characteristics of the circuit components of the differential inverters 601 through 604 can be reduced.

Figure 7:
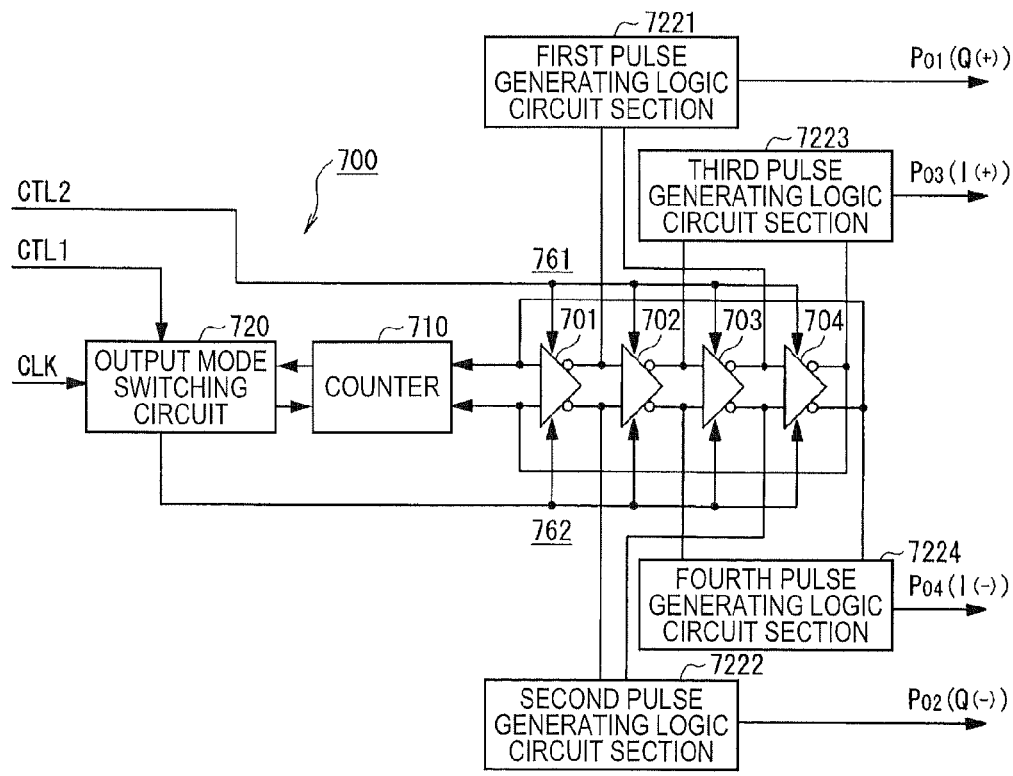
FIG. 7 is a diagram showing a pulse generating circuit as still another embodiment of the invention.

FIG. 7 is a diagram showing a pulse generating circuit as still another embodiment of the invention. The point in which the template pulse generating circuit 700 shown in FIG. 7 is different from the template pulse generating circuit 600 described above with reference to FIG. 6 is that the template pulse generating circuit 700 is configured to be able to further correct the frequency deviation in accordance with the control signal CTL2 as a frequency adjustment signal in addition to the configuration of capable of simultaneously obtaining the pair of differential outputs of the template pulses in the I phase and the pair of differential outputs of the template pulses in the Q phase shown in FIG. 6.

In particular in the present embodiment, a cascaded circuit composed of differential inverters 701 through 704 has the differential inverters 701 through 704 in the respective stages each configured as a variable delay differential inverter having a delay variable in accordance with the control signal, and each of the differential inverters 701 through 704 is provided with the control signal CTL2 as the frequency adjustment signal.

Therefore, it is arranged that the oscillation frequencies of the ring oscillator circuits 761, 762 can be adjusted by the control signal CTL2.

Figure 8:
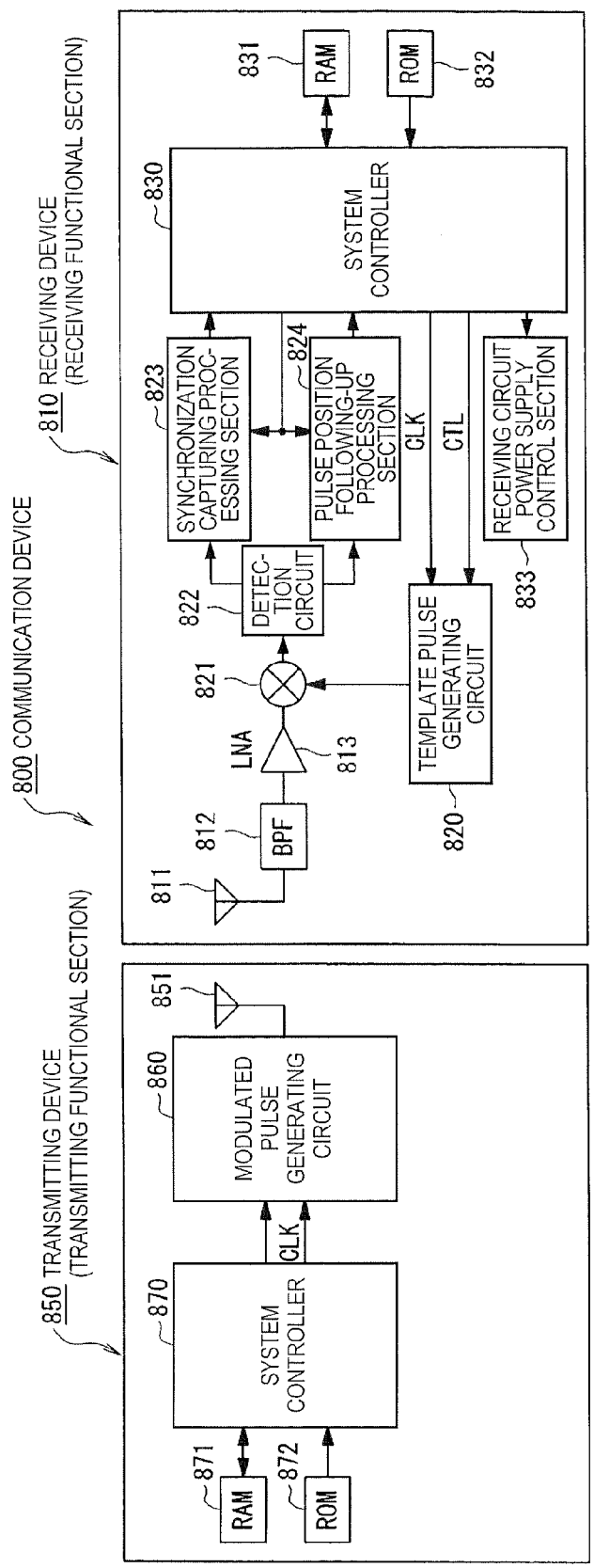
FIG. 8 is a diagram showing a configuration of a communication device as an embodiment of the invention.

FIG. 8 is a diagram showing a configuration of a communication device as an embodiment of the invention. The communication system is configured including a receiving device (including the case in which the receiving device is realized by a receiving functional section of the communication device) 810 provided with either one of the template pulse generating circuits described above and for performing a detection operation to a modulated pulse signal received therein, and a transmitting device (including the case in which the transmitting device is realized by a transmitting functional section of the communication device) 850 for transmitting the pulse signal to the receiving device 810.

It does not matter to understand that the system shown in FIG. 8 represents an integrated communication device 800 configured including the receiving functional section 810 and the transmitting functional section 850.

The transmitting functional section 850 forms the modulated pulse in a modulated pulse generating circuit 860 using data as a baseband signal and the clock pulse CLK supplied from a system controller 870, and transmits the modulated pulse from an antenna 851. A RAM 871 is connected to the system controller 870 to be used as a temporary storage of transmitted data, data in signal processing, and so on, and a ROM 872 is also connected thereto for holding information regarding a predetermined communication protocol, parameters used for operations, and so on.

In the receiving functional section 810, the transmitted pulse signal is received by an antenna 811, and the received signal is transmitted through a bandpass filter (BPF) 812, amplified by a low-noise amplifier (LNA) 813, and then supplied to a multiplier 821.

The template pulse is supplied from a template pulse generating circuit 820 corresponding to either one of the template pulse generating circuits described above with reference to FIGS. 1 through 7, and is multiplied by the received pulse signal amplified by the LNA 813.

The multiplied signal is treated with the detection process in a detection circuit 822, and based on the output of the detection circuit 822 a synchronization capturing process is performed in a synchronization capturing processing section 823. As a result, when the synchronization capturing is roughly established, a pulse position following-up process is performed by a pulse position following-up processing section 824 based on the output of the detection circuit 822.

There is provided a system controller 830 for controlling an operation of each sections for communication in the communication device 800 (the receiving functional section 810 thereof), and the system controller 830 performs monitoring of the progress and management of the processing timing of the synchronization capturing process in the synchronization capturing processing section 823 and the pulse position following-up process in the pulse position following-up processing section 824 described above.

In other words, the system controller 830 supplies the template pulse generating circuit 820 with the control signal CTL for switching the operation mode so as to make the template pulse generating circuit 820 operate in the continuous output mode described above in a synchronization capturing mode for performing the synchronization capturing when detecting the received pulse, and to make the template pulse generating circuit 820 operate in the intermittent output mode described above when the synchronization capturing is roughly established, and the clock pulse CLK forming a basis for arranging the operational timing of each section.

Therefore, it becomes possible to establish the synchronization capturing in a short period of time by continuously generating the template pulses at the beginning of the pulse communication, and thereafter, the template pulse generating circuit is switched to the intermittent output mode, thus the power consumption is reduced.

Further, a RAM 831 is connected to the system controller 830 to be used as a temporary storage of demodulated data, data in signal processing, and so on, and a ROM 832 is also connected thereto for holding information regarding a predetermined communication protocol, parameters used for operations, and so on. The demodulated data temporarily stored in the RAM 831 can be provided to the user in a form of a sound or an image by an arbitrary method according to needs.

It should be noted that there is provided a receiving circuit power supply control section 833 for controlling an operation power supply of each section of the receiving functional section 810 so as to operate under the control of the system controller 830, and the system controller 830 controls the receiving circuit power supply control section 833 to partially stop supplying the operation power supply of the communication device 800 (the receiving functional section 810) in the period when no receiving pulse arrives, thus minimization of unnecessary standby power can be achieved.

Figure 9:
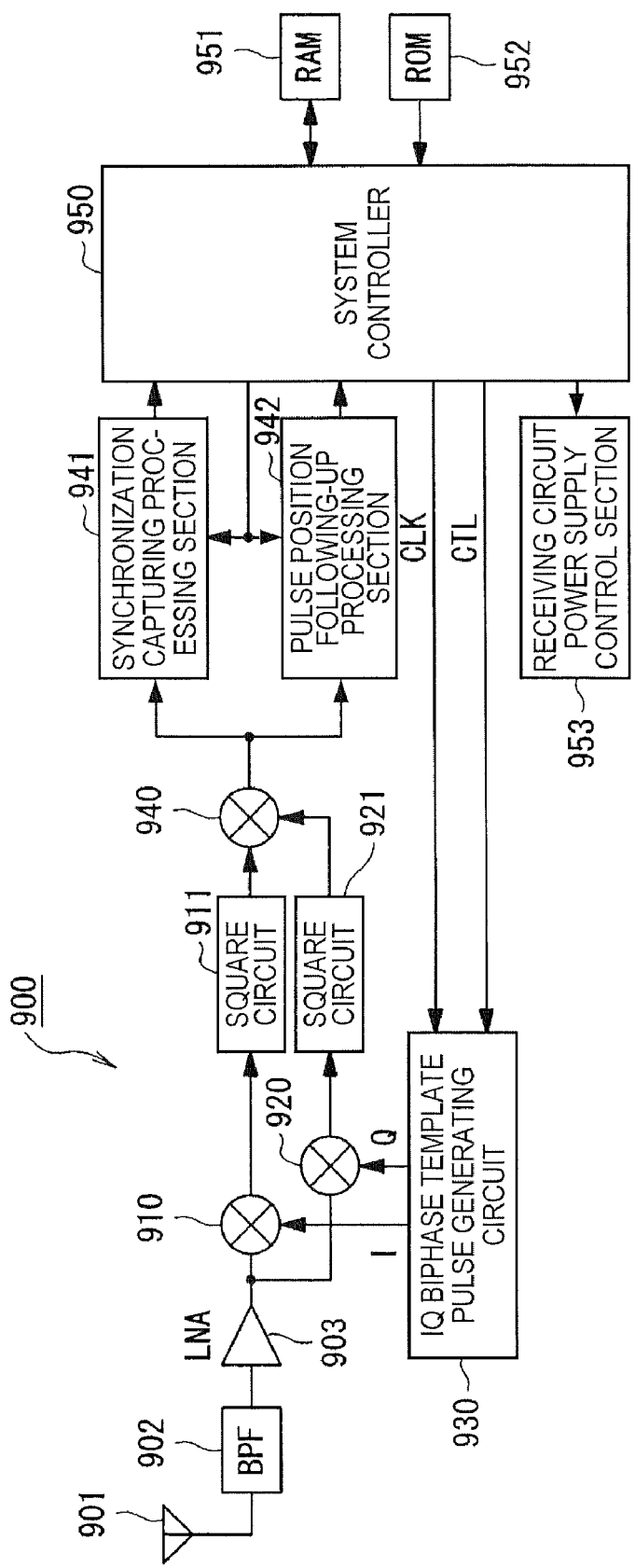
FIG. 9 is a diagram showing a configuration of a communication device as another embodiment of the invention.

FIG. 9 is a diagram showing a configuration of a communication device as another embodiment of the invention.

Figure 10:
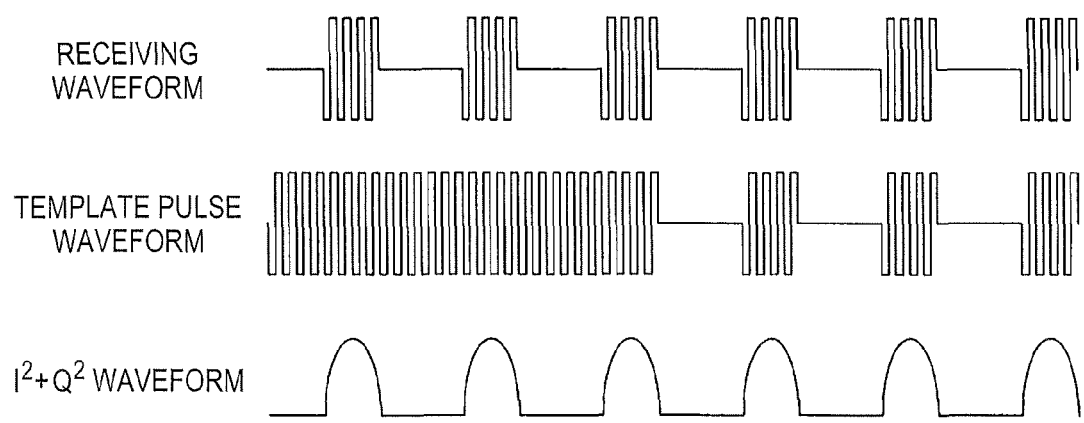
FIG. 10 is a timing chart regarding signals at some sections of the communication device shown in FIG. 9.

Further, FIG. 10 is a timing chart regarding signals at some sections of the communication device shown in FIG. 9.

The signal received at the antenna 901 is transmitted through a bandpass filter (BPF) 902, amplified by a low-noise amplifier (LNA) 903 ("RECEIVED WAVEFORM" shown in the upper column of FIG. 10), and supplied to a multiplier 910 in the I phase line and a multiplier 920 in the Q phase line.

The multipliers 910, 920 are provided with template pulses of the I phase and the Q phase, respectively, from a template pulse generating circuit 930 for outputting biphase template pulses of the I phase and the Q phase as described above with reference to FIG. 6 or 7, and the template pulses are each multiplied by the received pulse thus amplified in the LNA 903.

The I phase multiplication output pulse and the Q phase multiplication output pulse as a result of the multiplication by the multiplier (an I phase pulse multiplier) 910 of the I phase line and the multiplier (a Q phase pulse multiplier) 920 of the Q phase line in a manner as described above are supplied to a square circuit 911 as an I phase envelope detection processing circuit and a square circuit 921 as a Q phase envelope detection processing circuit respectively for performing an envelope detection process separately on the I phase multiplication output pulse and the Q phase multiplication output pulse, and are treated with a square operation to obtain values corresponding to the envelopes of the pulses, and then the both values are added by each other to be combined in an envelope signal adding circuit 940, as a result, a combined envelope signal ("$I^2+Q^2$ WAVEFORM" shown in the lower column of FIG. 10) can be obtained.

A synchronization capturing processing section 941 performs the synchronization capturing based on the combined envelope signal, and subsequently, a pulse position following-up processing section 942 performs the pulse position following-up process to obtain the baseband signal (data) as a detection output regarding the received pulse signal.

In this case, the operation mode is switched by the control signal CTL and the clock pulse CLK from the system controller 950 so as to make the template pulse generating circuit 930 operate in the continuous output mode in the synchronization capturing mode in which the synchronization capturing processing section 941 performs the synchronization capturing, and to make the template pulse generating circuit 930 operate in the intermittent output mode when the synchronization capturing is roughly established ("TEMPLATE PULSE WAVEFORM" shown in the middle column of FIG. 10).

Therefore, it becomes possible to establish the synchronization capturing in a short period of time by continuously generating the template pulses at the beginning of the pulse communication, and thereafter, the template pulse generating circuit is switched to the intermittent output mode, thus the power consumption is reduced.

Figure 11:
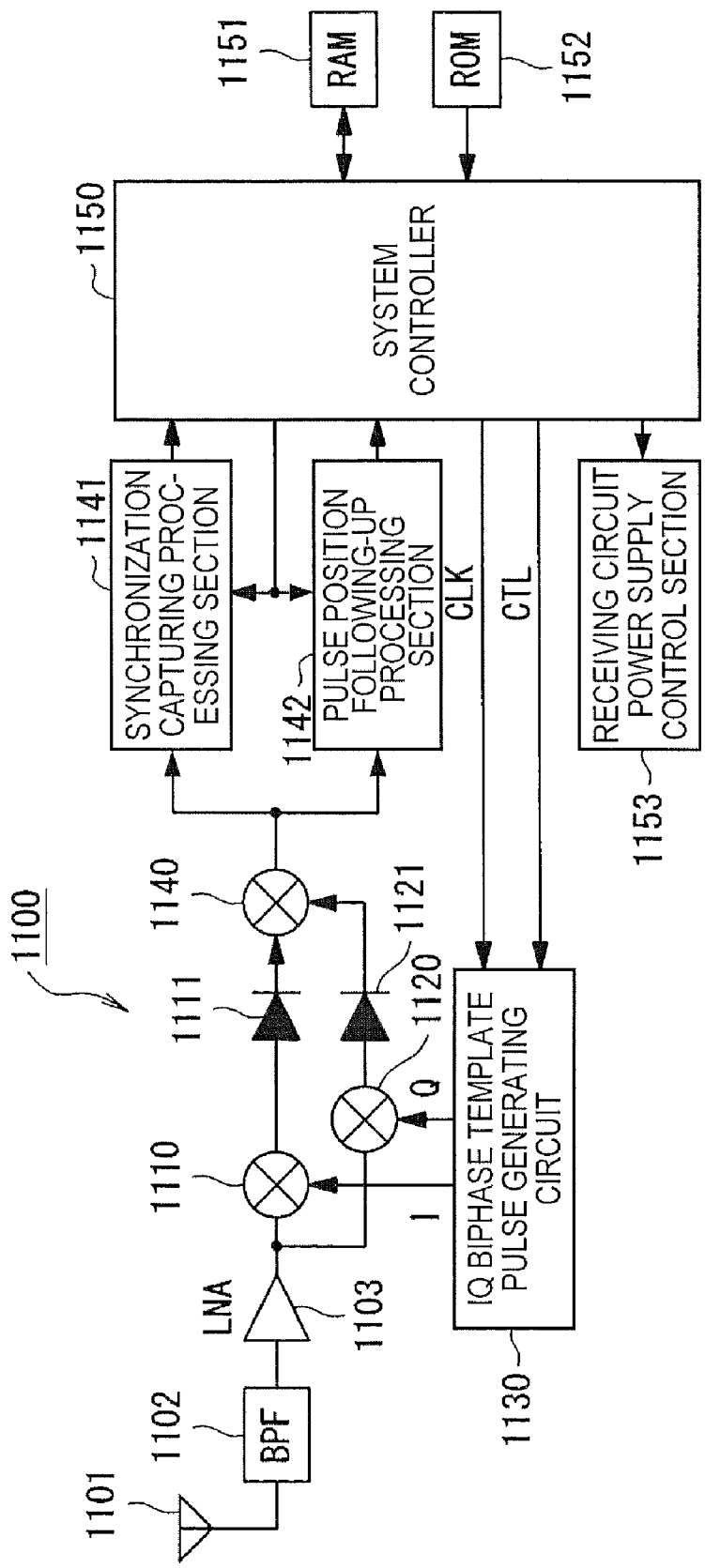
FIG. 11 is a diagram showing a configuration of a communication device as still another embodiment of the invention.

FIG. 11 is a diagram showing a configuration of a communication device as still another embodiment of the invention.

The point in which the embodiment shown in FIG. 11 is different from the embodiment shown in FIG. 9 is that in the embodiment shown in FIG. 11 rectifying circuits 1111, 1121 are used for the I phase envelope detection processing and the Q phase envelope detection processing as a measure for performing the envelope detection process while in the embodiment shown in FIG. 9 the square circuits 911, 921 are respectively used for the I phase envelope detection process and the Q phase envelope detection process as the measure for executing the envelope detection process separately on the I phase multiplication output pulse and the Q phase multiplication output pulse, thereby being separately treated with the square operation.

The signal received at the antenna 1101 is transmitted through a BPF 1102, amplified by an LNA 1103, and supplied to a multiplier 1110 in the I phase line and a multiplier 1120 in the Q phase line.

The multipliers 1110, 1120 are provided with template pulses of the I phase and the Q phase, respectively, from a template pulse generating circuit 1130 for outputting biphase template pulses of the I phase and the Q phase as described above with reference to FIG. 6 or 7, and the template pulses are each multiplied by the received pulse thus amplified in the LNA 1103.

The I phase multiplication output pulse and the Q phase multiplication output pulse as a result of the multiplication by the multiplier 1110 of the I phase line and the multiplier 1120 of the Q phase line in a manner as described above are supplied to a rectifying circuit 1111 as an I phase envelope detection processing circuit and a rectifying circuit 1121 as a Q phase envelope detection processing circuit respectively for performing an envelope detection process separately on the I phase multiplication output pulse and the Q phase multiplication output pulse, and are rectified (either of half-wave rectification as described in the drawing and full-wave rectification and be adopted) to obtain values corresponding to the envelopes of the pulses, and then the both values are added by each other to be combined in an envelope signal adding circuit 1140, as a result, a combined envelope signal can be obtained.

A synchronization capturing processing section 1141 performs the synchronization capturing based on the combined envelope signal, and subsequently, a pulse position following-up processing section 1142 performs the pulse position following-up process to obtain the baseband signal (data) as a detection output regarding the received pulse signal.

In this case, the operation mode is switched by the control signal CTL and the clock pulse CLK from the system controller 1150 so as to make the template pulse generating circuit 1130 operate in the continuous output mode in the synchronization capturing mode in which the synchronization capturing processing section 1141 performs the synchronization capturing, and to make the template pulse generating circuit 1130 operate in the intermittent output mode when the synchronization capturing is roughly established.

Therefore, it becomes possible to establish the synchronization capturing in a short period of time by continuously generating the template pulses at the beginning of the pulse communication, and thereafter, the template pulse generating circuit is switched to the intermittent output mode, thus the power consumption is reduced.

Figure 12:
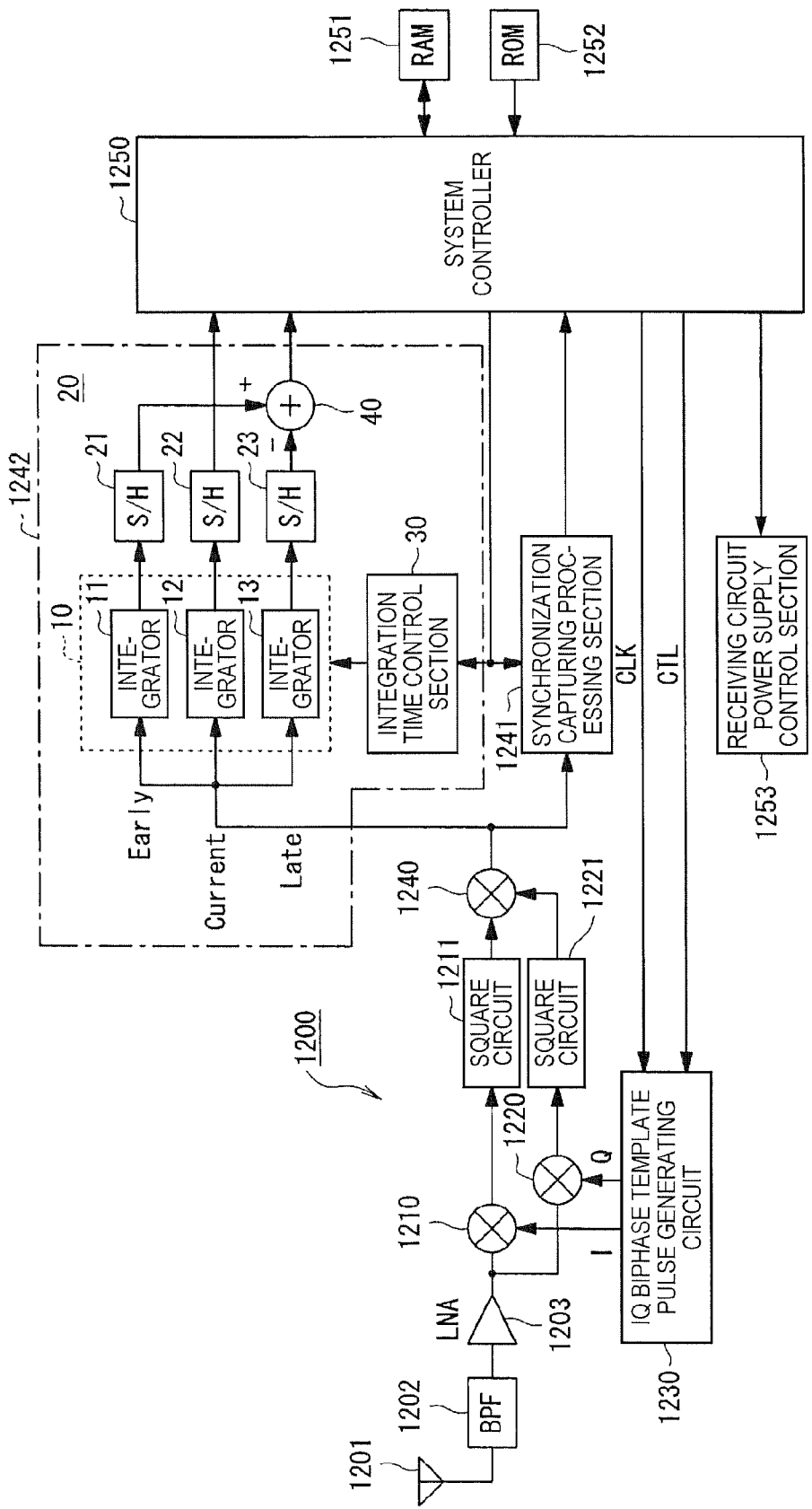
FIG. 12 is a diagram showing a detailed configuration example of the communication device shown in FIG. 9.

FIG. 12 is a diagram showing a communication device similar to the communication device shown in FIG. 9 accompanied with a specific configuration example of the pulse position following-up processing section.

In FIG. 12, a reference numeral for every section is reassigned, and the layout of the synchronization capturing processing section and the pulse position following-up processing section is expressed reversing the up and down arrangement.

The signal received at the antenna 1201 is transmitted through a BPF 1202, amplified by an LNA 1203, and supplied to a multiplier 1210 in the I phase line and a multiplier 1220 in the Q phase line.

The multipliers 1210, 1220 are provided with template pulses of the I phase and the Q phase, respectively, from a template pulse generating circuit 1230 for outputting biphase template pulses of the I phase and the Q phase as described above with reference to FIG. 6 or 7, and the template pulses are each multiplied by the received pulse thus amplified in the LNA 1203.

The I phase multiplication output pulse and the Q phase multiplication output pulse as a result of the multiplication by the multiplier 1210 of the I phase line and the multiplier 1220 of the Q phase line in a manner as described above are supplied to a square circuit 1211 as an I phase envelope detection processing circuit and a square circuit 1221 as a Q phase envelope detection processing circuit respectively for performing an envelope detection process separately on the I phase multiplication output pulse and the Q phase multiplication output pulse, and are treated with the square operation to obtain values corresponding to the envelopes of the pulses, and then the both values are added by each other to be combined in an envelope signal adding circuit 1240, as a result, a combined envelope signal can be obtained.

A synchronization capturing processing section 1241 performs the synchronization capturing based on the combined envelope signal, and subsequently, a pulse position following-up processing section 1242 illustrated with the dashed lines performs the pulse position following-up process to obtain the baseband signal (data) as a detection output regarding the received pulse signal.

In the above configuration, the pulse position following-up processing section 1242 is configured as a delay-locked loop (DLL) including an integration processing section 10 for integrating an input signal, a sample-hold processing section 20 for executing a sample-hold process on the output of the integration processing section 10, an integration time control section 30 for controlling the integration time in the integration processing section 10 by the control signal from the system controller 1250, and a adding circuit 40 for adding to combine outputs in a plurality of lines of the sample-hold processing section 20 and supplying the system controller 1250 with the output.

In other words, the pulse position following-up processing section 1242 is configured so as to have a phase advance DLL circuit (an integrator 11 and a sample-hold circuit 21), a same phase DLL circuit (an integrator 12 and a sample-hold circuit 22), and a phase delay DLL circuit (an integrator 13 and a sample-hold circuit 23) as DLL circuits for separately executing a phase advance operation (Early) for advancing the phase of the input, a phase keeping operation (Current) for keeping the phase, and a phase delay operation for delaying the phase, respectively, and to perform the pulse position following-up process based on the output of the adding circuit 40, which is a comparison between the integration values of the phase advance DLL circuit and the phase delay DLL circuit, thus the demodulation output is obtained based on the output of the same phase DLL circuit (the integrator 12 and the sample-hold circuit 22).

In this case, the operation mode is switched by the control signal CTL and the clock pulse CLK from the system controller 1250 so as to make the template pulse generating circuit 1230 operate in the continuous output mode in the synchronization capturing mode in which the synchronization capturing processing section 1241 performs the synchronization capturing, and to make the template pulse generating circuit 1230 operate in the intermittent output mode when the synchronization capturing is roughly established.

Therefore, it becomes possible to establish the synchronization capturing in a short period of time by continuously generating the template pulses at the beginning of the pulse communication, and thereafter, the template pulse generating circuit is switched to the intermittent output mode, thus the power consumption is reduced.

Figure 13:
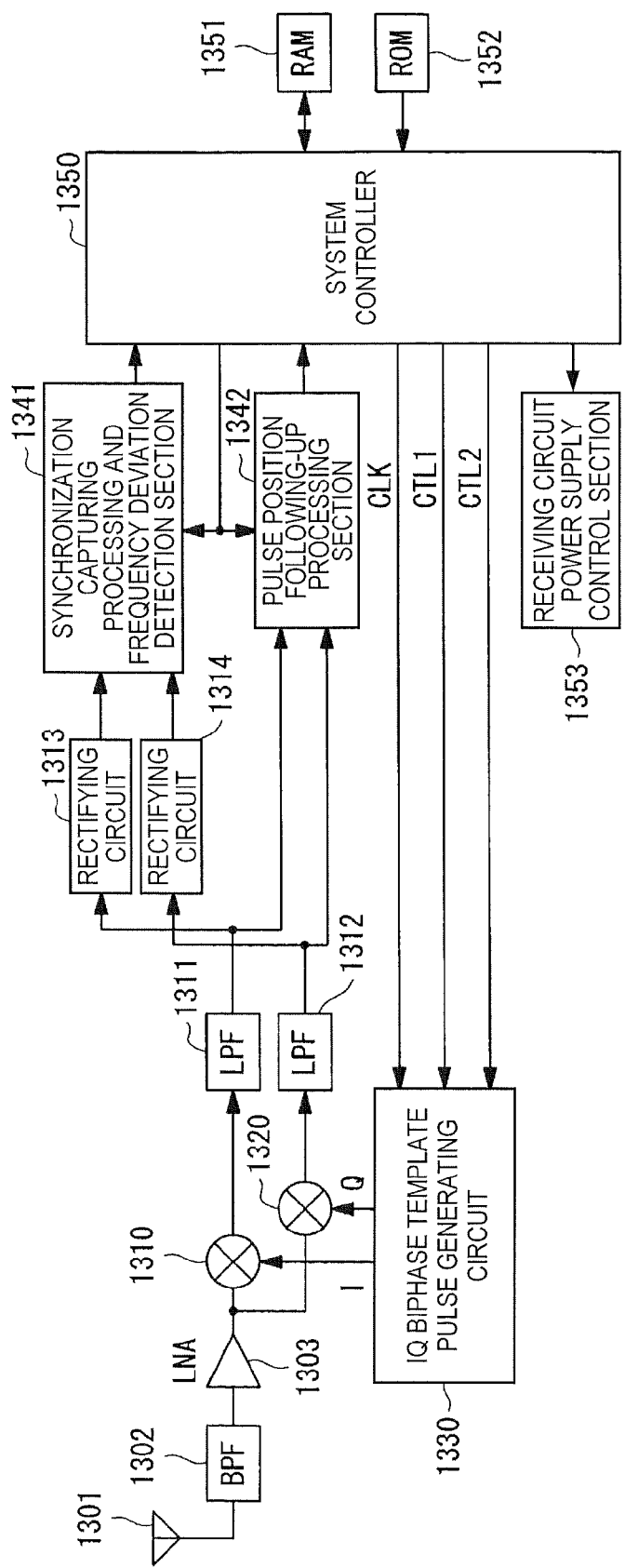
FIG. 13 is a diagram showing a configuration of a communication device as still another embodiment of the invention.

FIG. 13 is a diagram showing a configuration of a communication device as still another embodiment of the invention.

Figure 14:
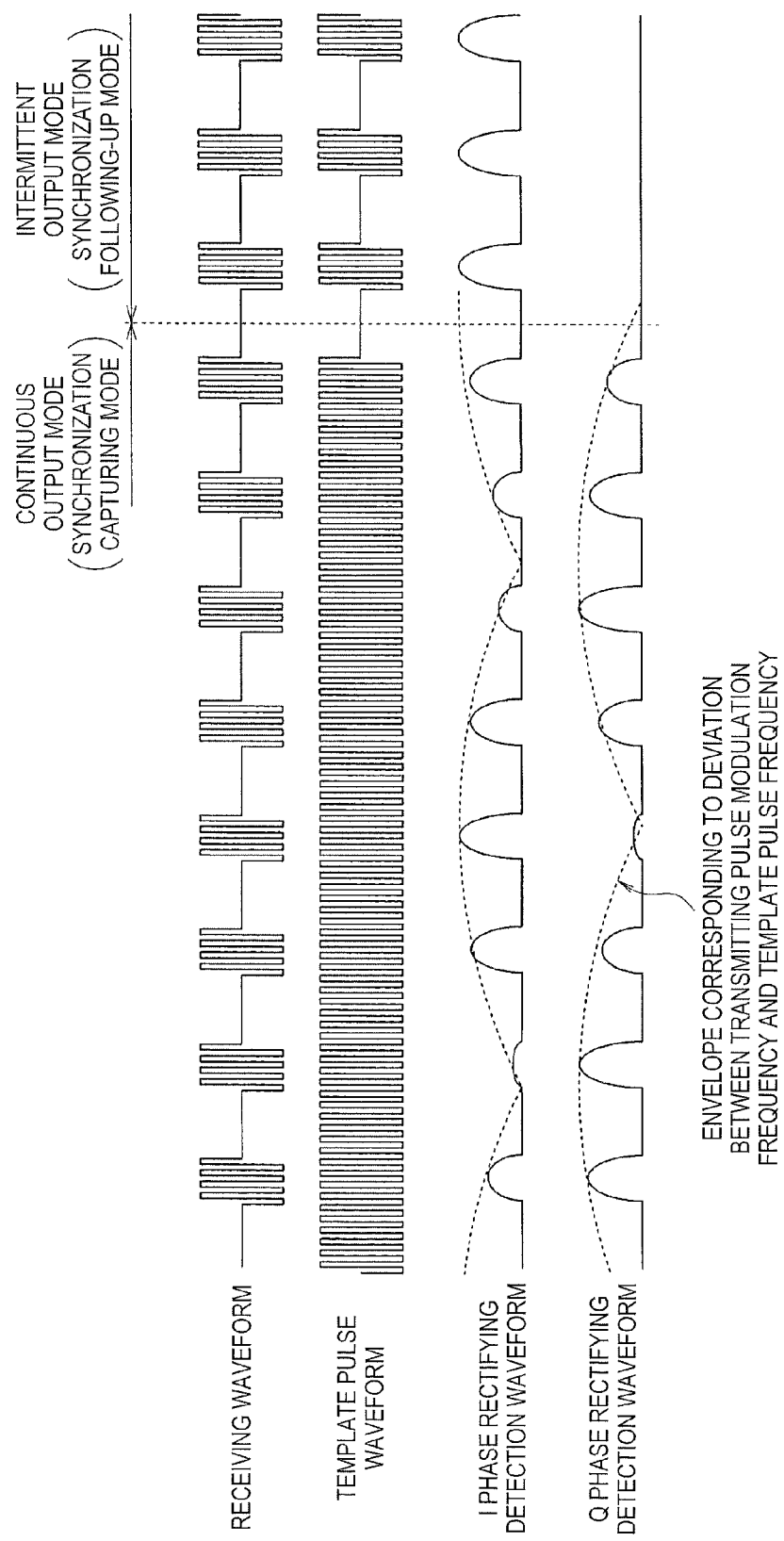
FIG. 14 is a timing chart regarding signals at some sections of the communication device shown in FIG. 13.

Further, FIG. 14 is a timing chart regarding signals at some sections of the communication device shown in FIG. 13.

The point in which the embodiment shown in FIG. 13 is different from the embodiment shown in FIG. 9 (details thereof is shown in FIG. 12) and FIG. 11 is that in the embodiment shown in FIG. 13 synchronous detection is executed while the envelope detection processing is executed on the I phase multiplication output pulse and the Q phase multiplication output pulse in the embodiment shown in FIGS. 9 and 11.

The signal received at the antenna 1301 is transmitted through a BPF 1302, amplified ("RECEIVED WAVEFORM" in FIG. 14) by an LNA 1303, and supplied to a multiplier 1310 in the I phase line and a multiplier 1320 in the Q phase line.

The multipliers 1310, 1320 are provided with template pulses of the I phase and the Q phase, respectively, from a template pulse generating circuit 1330 for outputting biphase template pulses of the I phase and the Q phase as described above with reference to FIG. 7, and the template pulses are each multiplied by the received pulse thus amplified in the LNA 1303.

The I phase multiplication output pulse and the Q phase multiplication output pulse as a result of the multiplication as described above in the multiplier 1310 of the I phase line and the multiplier 1320 of the Q phase line are transmitted through the respective low-pass filters (LPF) 1311, 1312 to remove high frequency components therefrom, further transmitted through the corresponding rectifying circuits 1313, 1314 ("I PHASE RECTIFYING DETECTION WAVEFORM" and "Q PHASE RECTIFYING DETECTION WAVEFORM" shown in FIG. 14), and supplied to a synchronization capturing processing and frequency deviation detection section 1341.

The synchronization capturing processing and frequency deviation detection section 1341 performs detection of the frequency deviation between the input pulse and the template pulse, and supplies the system controller 1350 with the detection result in addition to the synchronization capturing process as described above.

The system controller 1350 generates the control signal CTL2 as the frequency adjustment signal described above based on the frequency deviation with reference to FIG. 7, thus the frequency deviation regarding the template pulses output from the template pulse generating circuit 1330 is corrected in accordance with the control signal CTL2.

The synchronization capturing processing and frequency deviation detection section 1341 performs the synchronization capturing, and subsequently, a pulse position following-up processing section 1342 performs the pulse position following-up process to obtain the baseband signal (data) as a detection output regarding the received pulse signal.

In this case, the operation mode is switched by the control signal CTL1 from the system controller 1350 so as to make the template pulse generating circuit 1330 operate in the continuous output mode in the synchronization capturing mode in which the synchronization capturing processing and frequency deviation detection section 1341 performs the synchronization capturing, and to make the template pulse generating circuit 1330 operate in the intermittent output mode when the synchronization capturing is roughly established.

Therefore, it becomes possible to establish the synchronization capturing in a short period of time by continuously generating the template pulses at the beginning of the pulse communication, and thereafter, the template pulse generating circuit is switched to the intermittent output mode ("TEMPLATE PULSE WAVEFORM" shown in FIG. 14), thus the power consumption is reduced.

Figure 15:
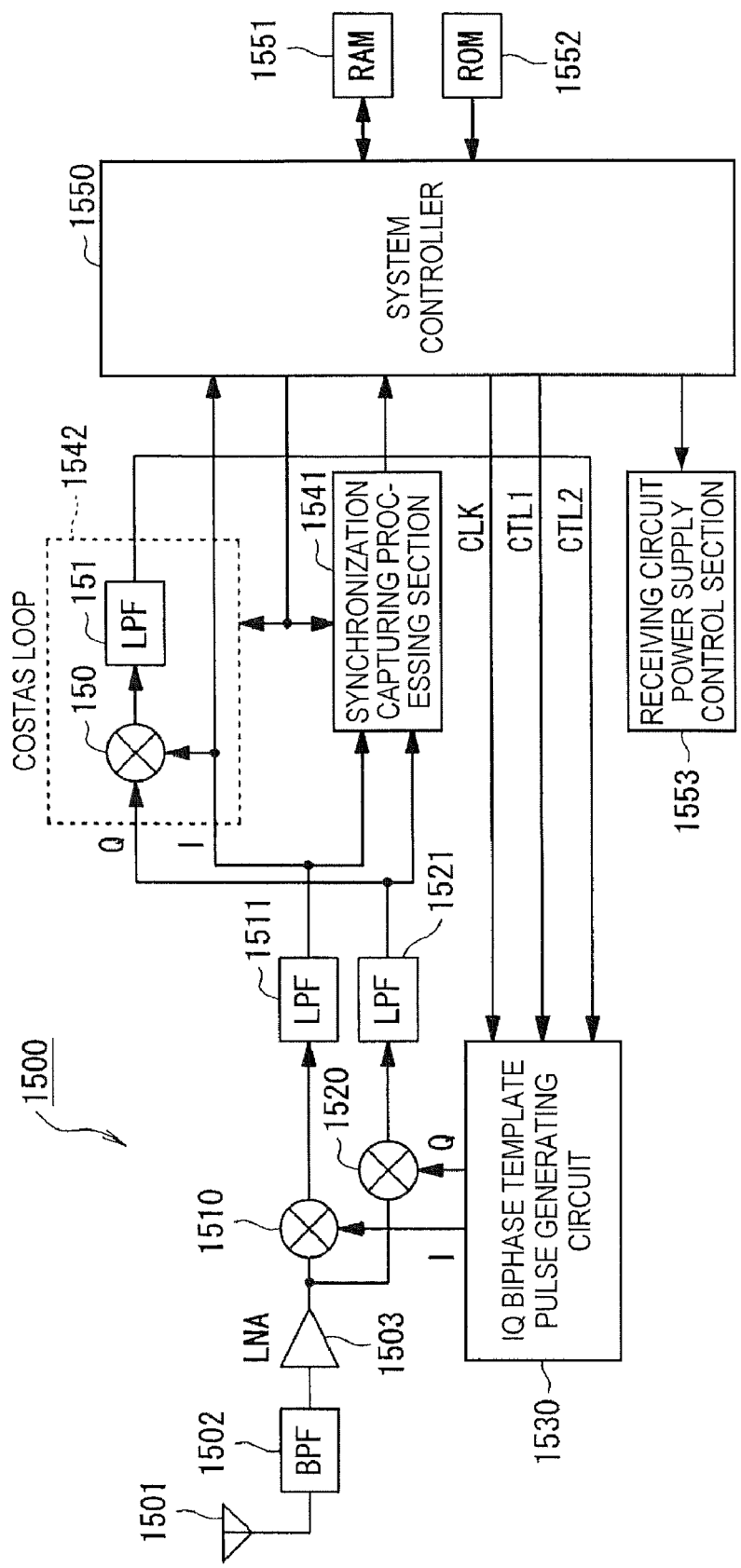
FIG. 15 is a diagram showing a configuration of a communication device as still another embodiment of the invention.

FIG. 15 is a diagram showing a configuration of a communication device as still another embodiment of the invention.

The point in which the embodiment shown in FIG. 15 is different from the embodiment shown in FIG. 13 is that in the embodiment shown in FIG. 15 the rectifying detection is performed using a Costas loop 1542 (a multiplier 150 and an LPF 151) while in the embodiment shown in FIG. 13 the rectifying detection is performed operating the synchronization capturing processing and frequency deviation detection section 1341.

The signal received at the antenna 1501 is transmitted through a BPF 1502, amplified by an LNA 1503, and supplied to a multiplier 1510 in the I phase line and a multiplier 1520 in the Q phase line.

The multipliers 1510, 1520 are provided with template pulses of the I phase and the Q phase, respectively, from a template pulse generating circuit 1530 for outputting biphase template pulses of the I phase and the Q phase as described above with reference to FIG. 7, and the template pulses are each multiplied by the received pulse thus amplified in the LNA 1503.

The I phase multiplication output pulse and the Q phase multiplication output pulse as a result of the multiplication as described above in the multiplier 1510 of the I phase line and the multiplier 1520 of the Q phase line are transmitted through the respective low-pass filters (LPF) 1511, 1512 to remove high frequency components therefrom, and supplied to a synchronization capturing processing section 1541 and the Costas loop 1542.

The Costas loop 1542 is configured including a multiplier 150 for multiplying both of the outputs of the LPF 1511 and the LPF 1512 by each other, and an LPF 151 for removing a high frequency component from the output of the multiplier 150, and when the synchronization capturing is roughly established by the synchronization capturing processing section 1541, the Costas loop 1542 detects the frequency deviation between the input pulses and the template pulses, and generates the control signal CTL2 as the frequency adjustment signal based on the detection result, thus the frequency deviation in the template pulses output by the template pulse generating circuit 1530 can be corrected in accordance with the control signal CTL2.

Further, the demodulated data obtained through the Costas loop 1542 is supplied to the system controller 1550, and then stored into the RAM 1551 connected to the system controller 1550.

In this case, the operation mode is switched by the control signal CTL1 from the system controller 1550 so as to make the template pulse generating circuit 1530 operate in the continuous output mode in the synchronization capturing mode in which the synchronization capturing processing section 1541 performs the synchronization capturing, and to make the template pulse generating circuit 1530 operate in the intermittent output mode when the synchronization capturing is roughly established.

Therefore, it becomes possible to establish the synchronization capturing in a short period of time by continuously generating the template pulses at the beginning of the pulse communication, and thereafter, the template pulse generating circuit is switched to the intermittent output mode, thus the power consumption is reduced.

Figure 16:
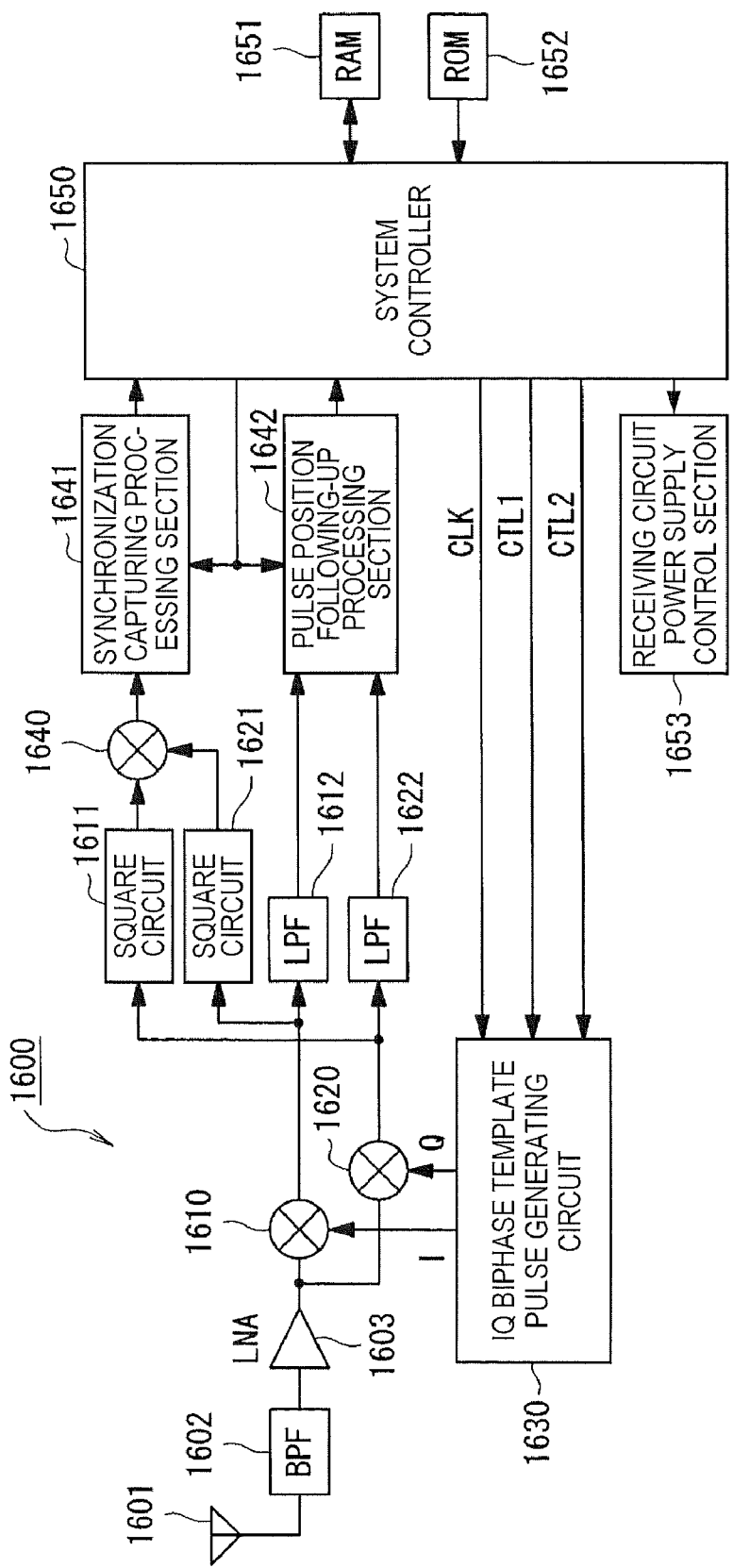
FIG. 16 is a diagram showing a configuration of a communication device as still another embodiment of the invention.

FIG. 16 is a diagram showing a configuration of a communication device as still another embodiment of the invention.

The point in which the embodiment shown in FIG. 16 is different from the embodiment shown in FIG. 9 (details thereof is shown in FIG. 12) and FIG. 11 is that in the embodiment shown in FIG. 16 synchronous detection is executed while the envelope detection processing is executed on the I phase multiplication output pulse and the Q phase multiplication output pulse in the embodiment shown in FIGS. 9 and 11.

The signal received at the antenna 1601 is transmitted through a BPF 1602, amplified by a low-noise amplifier (LNA) 1603, and supplied to a multiplier 1610 in the I phase line and a multiplier 1620 in the Q phase line.

The multipliers 1610, 1620 are provided with template pulses of the I phase and the Q phase, respectively, from a template pulse generating circuit 1630 for outputting biphase template pulses of the I phase and the Q phase as described above with reference to FIG. 7, and the template pulses are each multiplied by the received pulse thus amplified in the LNA 1603.

The I phase multiplication output pulse and the Q phase multiplication output pulse as a result of the multiplication by the multiplier 1610 of the I phase line and the multiplier 1620 of the Q phase line in a manner as described above are supplied to a square circuit 1611 as an I phase envelope detection processing circuit and a square circuit 1621 as a Q phase envelope detection processing circuit respectively for performing an envelope detection process separately on the I phase multiplication output pulse and the Q phase multiplication output pulse, and are treated with the square operation to obtain values corresponding to the envelopes of the pulses, and then the both values are added by each other to be combined in an envelope signal adding circuit 1640, as a result, a combined envelope signal (i.e., $I^2+Q^2$) can be obtained.

Further, on the other hand, the I phase multiplication output pulse and the Q phase multiplication output pulse as the respective outputs of the multiplier 1610 of the I phase line and the multiplier 1620 of the Q phase line are transmitted through the corresponding low-pass filters (LPF) 1612, 1622, respectively, to remove high frequency components therefrom, and then supplied to a pulse position following-up processing section 1642.

A synchronization capturing processing section 1641 performs the synchronization capturing based on the combined envelope signal described above, and subsequently, a pulse position following-up processing section 1642 performs the pulse position following-up process based on the I phase multiplication output pulse and the Q phase multiplication output pulse to obtain the baseband signal (data) as a detection output regarding the received pulse signal.

In this case, the operation mode is switched by the control signal CTL1 and the clock pulse CLK from the system controller 1650 so as to make the template pulse generating circuit 1630 operate in the continuous output mode in the synchronization capturing mode in which the synchronization capturing processing section 1641 performs the synchronization capturing, and to make the template pulse generating circuit 1630 operate in the intermittent output mode when the synchronization capturing is roughly established.

Further, the frequency of the template pulses in the template pulse generating circuit 1630 is adjusted based on the control signal CTL2 generated from the system controller 1650 based on the output of the pulse position following-up processing section 1642.

In the present embodiment, as described above, it becomes possible to establish the synchronization capturing in a short period of time by continuously generating the template pulses at the beginning of the pulse communication, and thereafter, the template pulse generating circuit is switched to the intermittent output mode, thus the power consumption is reduced.

The technical idea of the embodiments of the invention described hereinabove can be summarized as a communication method characterized in that the continuous output mode for continuously generating the template pulses used for detecting the received pulse is selected during the period of performing the synchronization capturing in the pulse communication, and in the period after the synchronization capturing has been roughly established, the output mode is switched to the intermittent output mode for intermittently generating the template pulses.

According to this communication method, it is arranged that the synchronization capturing is rapidly established using the continuous template pulses in the synchronization capturing mode at the beginning of the pulse communication, and thereafter the template pulses are output intermittently, thus it becomes possible to achieve significant reduction of the overall power consumption.

The entire disclosure of Japanese Patent Application Nos. 2007-049338, filed Feb. 28, 2007 and 2008-030387, filed Feb. 12, 2007 are expressly incorporated by reference herein.

What is claimed is:

1. A template pulse generating circuit that generates a template pulse used for detection of a received pulse in pulse communication, comprising an output mode switching circuit that switches an output mode in accordance with a supplied control signal between a continuous output mode that continuously outputs the template pulses and an intermittent output mode that intermittently outputs the template pulses so that the template pulse is generated in either one of the continuous output mode and the intermittent output mode; and a variable mode pulse generating circuit that generates the template pulses one of continuously and intermittently in accordance with an oscillation mode switching signal supplied to a mode control signal input terminal, wherein the output mode switching circuit supplies the mode control signal input terminal of the variable mode pulse generating circuit with the oscillation mode switching signal, wherein the variable mode pulse generating circuit is configured including a multi-stage inverter circuit section configured including a plurality of cascaded inverters, and a pulse generating logic circuit section including a plurality of switching elements controlled to be opened and closed by outputs of the inverters of the multi-stage inverter circuit section, and capable of generating the template pulse as an intermittent pulse signal with a higher frequency than the frequency of a clock pulse signal supplied to an input terminal of the first stage inverter of the inverters by connecting a predetermined output terminal to one of a positive side and a negative side of a power supply in accordance with opening and closing of the plurality of switching elements, wherein the multi-stage inverter circuit section is configured so that connection and disconnection of a feedback loop circuit can be switched in accordance with the oscillation mode switching signal supplied to the mode control signal input terminal, the feedback loop forming a ring oscillator circuit by forming a closed loop for feeding-back an output of a last stage inverter of a predetermined plurality of stages of inverters to an input terminal of a first stage inverter of the predetermined plurality of stages of inverters, and wherein the pulse generating logic circuit section generates the template pulses one of continuously and intermittently in accordance with the switching of connection and disconnection of the feedback loop circuit.

2. The template pulse generating circuit according to claim 1, further comprising:

a continuous pulse generating circuit that continuously generates the template pulses; and an intermittent pulse generating circuit that intermittently generates the template pulses, wherein the output mode switching circuit switching the output mode by selecting an output of either one of the continuous pulse generating circuit and the intermittent pulse generating circuit.

3. The template pulse generating circuit according to claim 1, wherein the multi-stage inverter circuit section is formed of a plurality of cascaded differential inverter circuits.

4. The template pulse generating circuit according to claim 1, further comprising a counter for counting oscillation pulses by the ring oscillator circuit, wherein the output mode switching circuit is configured so as to determine duration of the template pulses in the intermittent output mode in accordance with a count value of the counter.

5. The template pulse generating circuit according to claim 4, wherein the multi-stage inverter circuit section is configured so as to generate the template pulse of an I phase from an output terminal of a pulse generating logic circuit section of an I phase line by opening and closing the pertinent switching element of the corresponding pulse generating logic circuit section of the I phase line by an output of the even stage inverter, and to generate the template pulse of a Q phase from an output terminal of a pulse generating logic circuit section of a Q phase line by opening and closing the pertinent switching element of the corresponding pulse generating logic circuit section of the Q phase line by an output of the odd stage inverter.

6. The template pulse generating circuit according to claim 4, wherein the ring oscillator circuit is configured so as to have an oscillation frequency capable of being adjusted in accordance with a supplied frequency control signal.

7. A communication device, comprising:

a template pulse generating circuit according to claim 1;

a detection circuit that performs detection based on correlation between a received pulse and an output pulse of the template pulse generating circuit; and a system controller that supplies the template pulse generating circuit with a control signal that switches an operation mode so as to make the template pulse generating circuit operate in the continuous output mode in a synchronization capturing mode for performs synchronization capturing when detecting the received pulse, and to make the template pulse generating circuit operate in the intermittent output mode when the synchronization capturing is established.

8. A communication device, comprising:

a template pulse generating circuit according to claim 5;

an I phase pulse multiplier that multiplies a template pulse of an I phase of the template pulse generating circuit by a received pulse;

a Q phase pulse multiplier that multiplies a template pulse of a Q phase of the template pulse generating circuit by the received pulse;

an I phase envelope detection processing circuit that executes an envelope detection process on an I phase multiplication output pulse as an output of the I phase pulse multiplier;

a Q phase envelope detection processing circuit that executes the envelope detection process on a Q phase multiplication output pulse as an output of the Q phase pulse multiplier;

an envelope signal adding circuit for adds to combine an I phase envelope signal as an output of the I phase envelope detection processing circuit and a Q phase envelope signal as an output of the Q phase envelope detection processing circuit with each other;

a synchronization capturing processing section that performs the synchronization capturing based on a combined envelope signal as an output of the envelope signal adding circuit;

a pulse position following-up processing section that performs a pulse position following-up process based on the combined envelope signal; and a system controller that supplies the template pulse generating circuit with a control signal that switches an operation mode so as to make the template pulse generating circuit operate in the continuous output mode in a synchronization capturing mode in which the synchronization capturing processing section performs the synchronization capturing, and to make the template pulse generating circuit operate in the intermittent output mode when the synchronization capturing is established.

9. The communication device according to claim 8,
wherein the I phase envelope detection processing circuit is configured including an I phase pulse square circuit that squares the I phase multiplication output pulse, and
the Q phase envelope detection processing circuit is configured including a Q phase pulse square circuit that squares the Q phase multiplication output pulse.

10. The communication device according to claim 8,
wherein the I phase envelope detection processing circuit is configured including an I phase pulse rectifying circuit that rectifies the I phase multiplication output pulse, and
the Q phase envelope detection processing circuit is configured including a Q phase pulse rectifying circuit that rectifies the Q phase multiplication output pulse.

11. The communication device according to claim 8,
wherein the pulse position following-up processing section is configured so as to performing the pulse position following-up process based on comparison between an integration value of a phase advance DLL circuit that performs a phase advance process for advancing a phase and an integration value of a phase delay DLL circuit that performs a phase delay process for delaying a phase, and to obtain a demodulated output based on an output of a same phase DLL circuit that performs a phase keeping process for keeping a phase.

12. The communication device according to claim 8,
wherein the synchronization capturing processing section is configured including a synchronous detection functional section that performs a frequency adjusting process that matches the frequencies of the template pulse and the received pulse in addition to performing a phase synchronization process between the template pulse and the received pulse.

13. The communication device according to claim 7, further comprising
a storage functional section that stores pulse position information obtained when the synchronization capturing is established.

14. The communication device according to claim 13,
wherein the system controller is configured so as to supply the template pulse generating circuit with a clock pulse used for operating the template pulse generating circuit in the intermittent output mode in accordance with the pulse position information stored in the storage functional section.

15. The communication device according to claim 7, further comprising
a power supply control section that controls supply of an operation power,
wherein the system controller controls the power supply control section to partially stop supplying the power in a period when no received pulse arrives.

* * * * *